United States Patent
Kim et al.

(10) Patent No.: US 11,733,603 B2
(45) Date of Patent: Aug. 22, 2023

(54) PROXIMITY CORRECTION METHODS FOR SEMICONDUCTOR MANUFACTURING PROCESSES

(71) Applicant: Samsung Electronics Co., Ltd., Suwon-si (KR)

(72) Inventors: Taehoon Kim, Suwon-si (KR); Jaeho Jeong, Suwon-si (KR); Jeonghoon Ko, Hwaseong-si (KR); Jongwon Kim, Hwaseong-si (KR); Yejin Jeong, Suwon-si (KR); Changwook Jeong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 160 days.

(21) Appl. No.: 17/180,984

(22) Filed: Feb. 22, 2021

(65) Prior Publication Data
US 2021/0405521 A1    Dec. 30, 2021

(30) Foreign Application Priority Data
Jun. 29, 2020    (KR) .................. 10-2020-0079418

(51) Int. Cl.
*G03F 1/36* (2012.01)
*H01L 21/027* (2006.01)
(Continued)

(52) U.S. Cl.
CPC ............ *G03F 1/36* (2013.01); *G03F 7/70441* (2013.01); *G03F 7/70625* (2013.01); *H01L 21/027* (2013.01)

(58) Field of Classification Search
CPC .... G03F 1/36; G03F 7/70441; G03F 7/70625; G03F 7/705; H01L 21/027
See application file for complete search history.

(56) References Cited

U.S. PATENT DOCUMENTS

| | | |
|---|---|---|
| 10,386,726 B2 | 8/2019 | Cao et al. |
| 10,402,524 B2 | 9/2019 | Cao et al. |

(Continued)

FOREIGN PATENT DOCUMENTS

| | | |
|---|---|---|
| JP | 3333176 B2 | 7/2002 |
| KR | 20110138083 A | 12/2011 |

(Continued)

OTHER PUBLICATIONS

"Shim, et al. "Etch Proximity Correction through Machine-Learning-Driven Etch Bias Model", Proc. of SPIE vol. 9782" (Mar. 23, 2016).
(Continued)

*Primary Examiner* — Deoram Persaud
(74) *Attorney, Agent, or Firm* — Myers Bigel, P.A.

(57) ABSTRACT

A proximity correction method for a semiconductor manufacturing process includes: generating a plurality of pieces of original image data from a plurality of sample regions, with the sample regions selected from layout data used in the semiconductor manufacturing process; removing some pieces of original image data that overlap with each other from the plurality of pieces of original image data, resulting in a plurality of pieces of input image data; inputting the plurality of pieces of input image data to a machine learning model; obtaining a prediction value of critical dimensions of target patterns included in the plurality of pieces of input image data from the machine learning model; measuring a result value for critical dimensions of actual patterns corresponding to the target patterns on a semiconductor substrate on which the semiconductor manufacturing process is performed; and performing learning of the machine learning model using the prediction value and the result value.

20 Claims, 28 Drawing Sheets

(51) Int. Cl.
*G03F 7/20* (2006.01)
*G03F 7/00* (2006.01)

(56) References Cited

U.S. PATENT DOCUMENTS

| | | | |
|---|---|---|---|
| 10,445,461 | B2 | 10/2019 | Zhang et al. |
| 10,534,257 | B2* | 1/2020 | Tetiker .............. H01J 37/32009 |
| 2011/0314431 | A1 | 12/2011 | Kim |
| 2013/0219349 | A1 | 8/2013 | Lee et al. |
| 2015/0287176 | A1* | 10/2015 | Coskun ............... G03F 7/70433 |
| | | | 382/144 |
| 2017/0363950 | A1 | 12/2017 | Sriraman et al. |
| 2018/0336465 | A1 | 11/2018 | Kim et al. |
| 2019/0147134 | A1 | 5/2019 | Wang et al. |
| 2019/0213725 | A1 | 7/2019 | Liang et al. |
| 2020/0050099 | A1 | 2/2020 | Su et al. |
| 2020/0380362 | A1* | 12/2020 | Cao .......................... G06N 3/08 |
| 2021/0357566 | A1* | 11/2021 | Simmons .............. G06F 30/392 |
| 2021/0382393 | A1* | 12/2021 | Hansen ................. G06F 30/398 |
| 2022/0028052 | A1* | 1/2022 | Li .......................... G03F 7/7065 |
| 2022/0179321 | A1* | 6/2022 | Ma ...................... G03F 7/70666 |
| 2022/0180503 | A1* | 6/2022 | Oh .......................... G06F 18/22 |
| 2022/0229375 | A1* | 7/2022 | Fu ....................... G03F 7/70616 |
| 2022/0284344 | A1* | 9/2022 | Ma ...................... G03F 7/70625 |
| 2022/0291590 | A1* | 9/2022 | Su ........................... G03F 7/705 |
| 2023/0055365 | A1* | 2/2023 | Kim ........................... G03F 1/36 |
| 2023/0076218 | A1* | 3/2023 | Van Ingen Schenau .................... G03F 7/70641 |

FOREIGN PATENT DOCUMENTS

| | | |
|---|---|---|
| KR | 20170143445 A | 12/2017 |
| KR | 101855803 B1 | 5/2018 |
| KR | 20200035303 A | 4/2020 |

OTHER PUBLICATIONS

"Watanabe, et al. "Accurate Lithography Simulation Model based on Convolutional Neural Networks" Proc. of SPIE vol. 10454" (Jul. 13, 2017).

* cited by examiner

720

| APX1 | APX2 | APX3 | APX4 |
|---|---|---|---|
| VW1 ( HW1 | | | HW2 |
| APX5 | FPX1 | FPX2 | APX6 |
| APX7 | FPX3 | FPX4 | APX8 |
| VW2 ( | | | |
| APX9 | APX10 | APX11 | APX12 |

PROXIMITY CORRECTION METHODS FOR SEMICONDUCTOR MANUFACTURING PROCESSES

CROSS-REFERENCE TO RELATED APPLICATION(S)

This application claims benefit of priority to Korean Patent Application No. 10-2020-0079418, filed on Jun. 29, 2020, in the Korean Intellectual Property Office, the disclosure of which is incorporated by reference herein in its entirety.

BACKGROUND

The present disclosure relates to proximity correction methods for semiconductor manufacturing processes.

A semiconductor manufacturing process may be performed based on layout data. Various patterns may be formed on a semiconductor substrate by processes such as an exposure process in which layout data is transferred to form masks or the like, an etching process using the masks formed in the exposure process, a deposition process, and other processes.

SUMMARY

Aspects of the present disclosure provide proximity correction methods, which may optimize layout data used in performing semiconductor manufacturing processes. The proximity correction methods may reduce a difference between the layout data and various patterns formed using the layout data, and in some embodiments may significantly reduce a difference between the layout data and the formed patterns.

According to some example embodiments, a proximity correction method for a semiconductor manufacturing process includes: generating a plurality of pieces of original image data from a plurality of sample regions, wherein the sample regions are selected from layout data used in the semiconductor manufacturing process and wherein at least some of the plurality of pieces of original image data overlap each other; removing some of the pieces of original image data that overlap with each other from the plurality of pieces of original image data, resulting in a plurality of pieces of input image data; inputting the plurality of pieces of input image data to a machine learning model; obtaining a prediction value of critical dimensions of target patterns included in the plurality of pieces of input image data from the machine learning model; measuring a result value for critical dimensions of actual patterns corresponding to the target patterns on a semiconductor substrate on which the semiconductor manufacturing process is performed; and performing learning of the machine learning model using the prediction value and the result value.

According to some example embodiments, a proximity correction method for a semiconductor manufacturing process includes: generating pieces of sample image data comprising a target pattern a critical dimension thereof is to be adjusted and comprising surrounding patterns adjacent to the target pattern, and a plurality of pieces of adjusted image data in which the critical dimension of the target pattern is changed in the pieces of sample image data; inputting the pieces of sample image data and the plurality of pieces of adjusted image data to a machine learning model; obtaining a prediction value for the critical dimension of the target pattern from each of the pieces of sample image data and the plurality of pieces of adjusted image data from the machine learning model; determining a sensitivity of the machine learning model using the critical dimension of the target pattern, obtained from each of the pieces of sample image data and the plurality of pieces of adjusted image data, and the prediction value; correcting an output value of the machine learning model based on the sensitivity; and modifying the layout data based on the corrected output value.

According to some example embodiments, a proximity correction method for a semiconductor manufacturing process includes: generating a plurality of pieces of input image data from a plurality of sample regions, wherein the sample regions are selected from layout data used in the semiconductor manufacturing process; inputting the plurality of pieces of input image data to a machine learning model; obtaining a first prediction value for critical dimensions of target patterns included in the plurality of pieces of input image data; measuring a result value for critical dimension of actual patterns on a semiconductor substrate manufactured using the semiconductor manufacturing process that correspond to the target patterns, and performing learning of the machine learning model using the first prediction value and the result value; adjusting a critical dimension of the target pattern in at least one piece of sample image data selected from the layout data to generate a plurality of pieces of adjusted image data; inputting the pieces of sample image data and the plurality of pieces of adjusted image data to the machine learning model to obtain a second prediction value of the critical dimension of the target pattern included in each of the pieces of sample image data and the plurality of pieces of adjusted image data; determining a sensitivity of the machine learning model using the critical dimension of the target pattern, obtained from each of the pieces of sample image data and the plurality of pieces of adjusted image data, and the second prediction value; and optimizing the machine learning model using the sensitivity.

BRIEF DESCRIPTION OF DRAWINGS

The above and other aspects, features, and advantages of the present disclosure will be more clearly understood from the following detailed description, taken in conjunction with the accompanying drawings.

FIGS. 13 to 15 illustrate a method of learning a machine learning model in a proximity correction method for semiconductor manufacturing processes according to some example embodiments.

FIGS. 22 to 26 illustrate a method of determining sensitivity of a machine learning model in a proximity correction method for semiconductor manufacturing processes according to some example embodiments.

DETAILED DESCRIPTION

Hereinafter, some example embodiments will be described with reference to the accompanying drawings.

A semiconductor manufacturing process may include various processes such as a deposition process, an etching process, and a polishing process, as examples. Various patterns may be formed on a semiconductor substrate and/or layers formed on the semiconductor substrate by the semiconductor manufacturing process. In some example embodiments, patterns may be formed using a mask formed from layout data having a shape corresponding to the patterns. However, errors may occur while forming a mask or masks from the layout data and/or while performing a process using the formed mask or masks, such as a deposition process, an etching process, a polishing process, or another process. These errors may result in a difference between a shape of patterns included in the layout data and a shape of actual patterns formed by a semiconductor manufacturing process.

Figure 1:
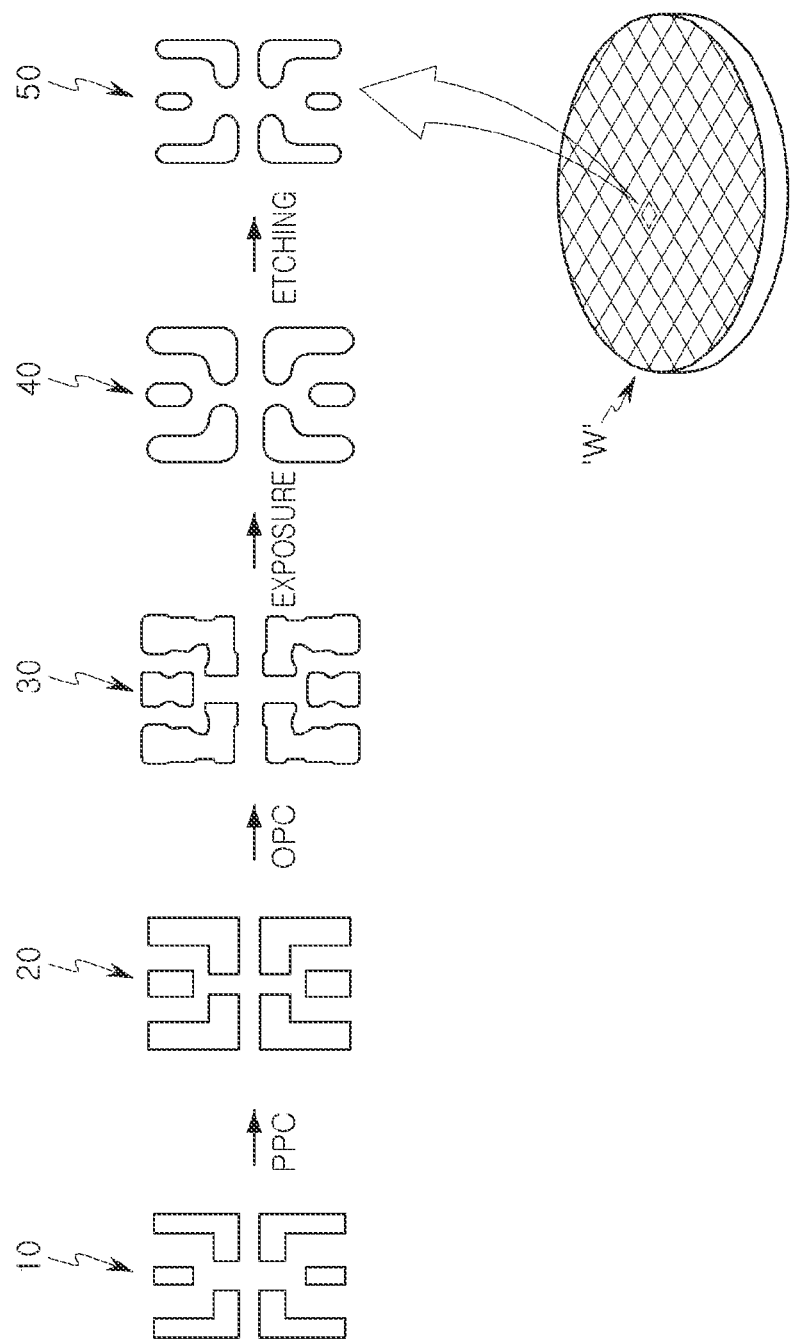
FIGS. 1 and 2 illustrate aspects of semiconductor manufacturing processes according to some example embodiments.
Figure 2:
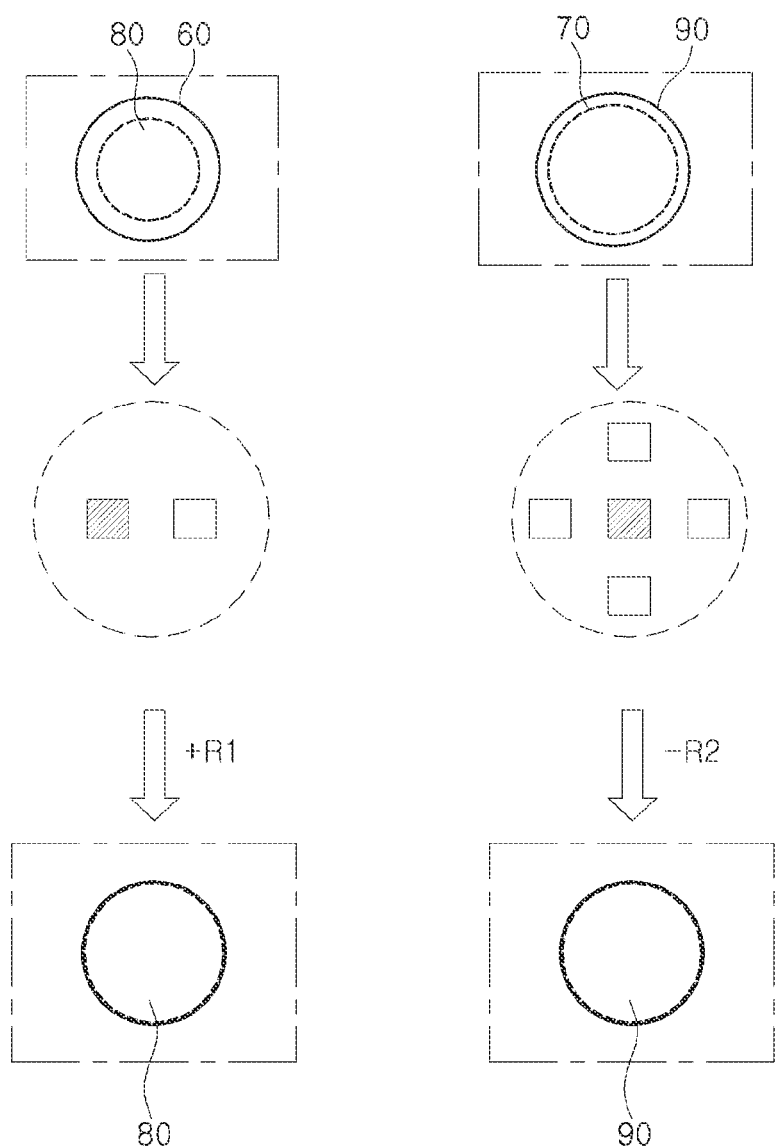

FIGS. 1 and 2 illustrate aspects of semiconductor manufacturing processes according to some example embodiments. Referring to FIG. 1, original layout data 10 may be generated. The original layout data 10 may indicate a design for patterns to be formed. As an example, the original layout data 10 may be provided as data in a graphic design system (GDS) format. According to some example embodiments, a design rule check (DRC) operation for the original layout data 10 and/or a layout versus schematic (LVS) operation for verifying whether layout data matches original intended data may be performed. In some embodiments, when the original layout data 10 is generated and/or verified through the above operations, process proximity correction (PPC) may be performed on the original layout data 10 to generate corrected layout data 20.

At least some patterns included in the corrected layout data 20 may have a shape and/or a size that differs from a shape and/or a size of corresponding patterns included in the original layout data 10. An optical proximity correction operation may be performed using the corrected layout data 20 to compensate for an optical proximity effect that occurs or may occur in an exposure process, and mask data 30 may be obtained as a result of the optical proximity correction operation.

The exposure process may be performed using the mask data 30. As an example, the exposure process may be performed by irradiating light to pass through the patterns included in the mask data 30 or by irradiating light to pass through a region excluding the patterns included in the mask data 30, and a mask layer 40 may be obtained. Patterns included in the mask layer 40 may have a shape and/or a size that differs from a shape and/or a size of the corresponding patterns included in the mask data 30 due to the optical proximity effect occurring in the exposure process.

A semiconductor manufacturing process may be performed using the mask layer 40 to form physical or actual patterns 50 on a semiconductor substrate W. As an example, in an etching process, the semiconductor substrate W and/or layers on the semiconductor substrate W may be etched in a region exposed by patterns included in the mask layer 40. The etched region may be a region not covered with the patterns included in the mask layer 40. In some example embodiments, the semiconductor substrate W may be a wafer including a semiconductor material.

A difference between the patterns included in the layout data 10 and 20 prior to generation of the mask data 30 and the actual patterns 50 formed on the semiconductor substrate W by a semiconductor manufacturing process may be reduced, and in some cases the difference between the layout data 10 and 20 and the actual patterns 50 may be significantly reduced. Reducing the difference between the layout data 10 and the actual patterns 50 may improve accuracy and yield of the semiconductor manufacturing process. In some example embodiments, at least one of the layout data 10 and 20 may be input to a machine learning model to obtain prediction values for critical dimensions of target patterns among the patterns included in the layout data 10 and 20. A prediction value may be a value obtained by predicting critical dimensions of actual patterns 50 that will be formed by forming the mask layer 40 using the layout data 10 and 20 and performing a semiconductor manufacturing process. When the prediction value has a difference from a target value of a critical dimension intended during a design, the difference may be accounted for in the process proximity correction (PPC). Thus, the accuracy and yield of the semiconductor manufacturing process may be improved, and distribution of patterns formed by the semiconductor manufacturing process may be reduced.

In the example embodiment illustrated in FIG. 2, first and second actual patterns 80 and 90 may be formed by a semiconductor manufacturing process. Each of the actual patterns 80 and 90 may have a circular cross section. Referring to FIG. 2, first and second design patterns 60 and 70 in layout data may be designed to have the same critical dimension, while the first and second actual patterns 80 and 90 respectively corresponding to the first and second design patterns 60 and 70 and formed by the semiconductor manufacturing process may have different critical dimensions. In other words, the intended design, as reflected in the design patterns 60 and 70, is that the actual patterns 80 and 90 have the same critical dimension, but the semiconductor manufacturing process results in actual patterns 80 and 90 of different critical dimensions. As an example, among the patterns formed in a semiconductor manufacturing process, a first actual pattern 80 may have a smaller critical dimension than the design patterns 60 and 70, and the second actual pattern 90 may have a larger critical dimension than the design patterns 60 and 70.

To address the above-described distribution of the critical dimensions, the critical dimensions of the design patterns 60 and 70 may be adjusted in consideration of the number of surrounding patterns and/or a distance from the surrounding patterns. For example, and with reference to the middle portion of FIG. 2, the first actual pattern 80, which may have a small number of surrounding patterns, may be formed to have a smaller critical dimension than the first design pattern 60 that corresponds to the first actual pattern 80. Accordingly, a critical dimension of the first design pattern 60 may be increased by a first correction value R1 in the layout data to significantly reduce a difference between the critical dimension of the first actual pattern 80 and the critical dimension of the first design pattern 60.

Meanwhile, the second actual pattern 90, which may have a greater number of surrounding patterns, may be formed to have a larger critical dimension than the second design pattern 70 that corresponds to the second actual pattern 90. Accordingly, the critical dimension of the second design pattern 70 may be decreased by a first correction value R2 in the layout data to significantly reduce a difference between the critical dimension of the second actual pattern 90 and the critical dimension of the second design pattern 70. In addition, the layout data may be modified as described above to reduce a difference between critical dimensions of the actual patterns 80 and 90 that are formed by the semiconductor manufacturing process.

Methods of adjusting the critical dimensions of the first and second design patterns 60 and 70 in consideration of the number of surrounding patterns and/or the distance from the surrounding patterns may not reflect all of the number, disposition, and the like, of the surrounding patterns. The number of cases, which may be defined based on the number and disposition of surrounding patterns arranged around the design patterns 60 and 70, may not cover all of the patterns included in the layout data. Accordingly, there may be difficulties in reducing a difference between critical dimensions of patterns, formed by a semiconductor manufacturing process, and improving a distribution of the patterns.

Some example embodiments of the present disclosure provide methods in which a prediction value of a critical dimension is obtained using a machine learning model and layout data is modified using the prediction value, rather than a method in which layout data is simply modified based on the number of surrounding patterns and/or a distance from surrounding patterns. For example, the machine learning model may receive and process patterns, included in layout data, in the form of images and may output prediction values for critical dimensions of patterns formed by performing a semiconductor manufacturing process using the layout data. The prediction value may be compared with a target value for critical dimensions of patterns to be formed by a semiconductor manufacturing process, and the layout data may be modified. Accordingly, the yield and accuracy of the semiconductor manufacturing process may be improved, and/or distribution of the critical dimension of the patterns may be reduced.

Figure 3:
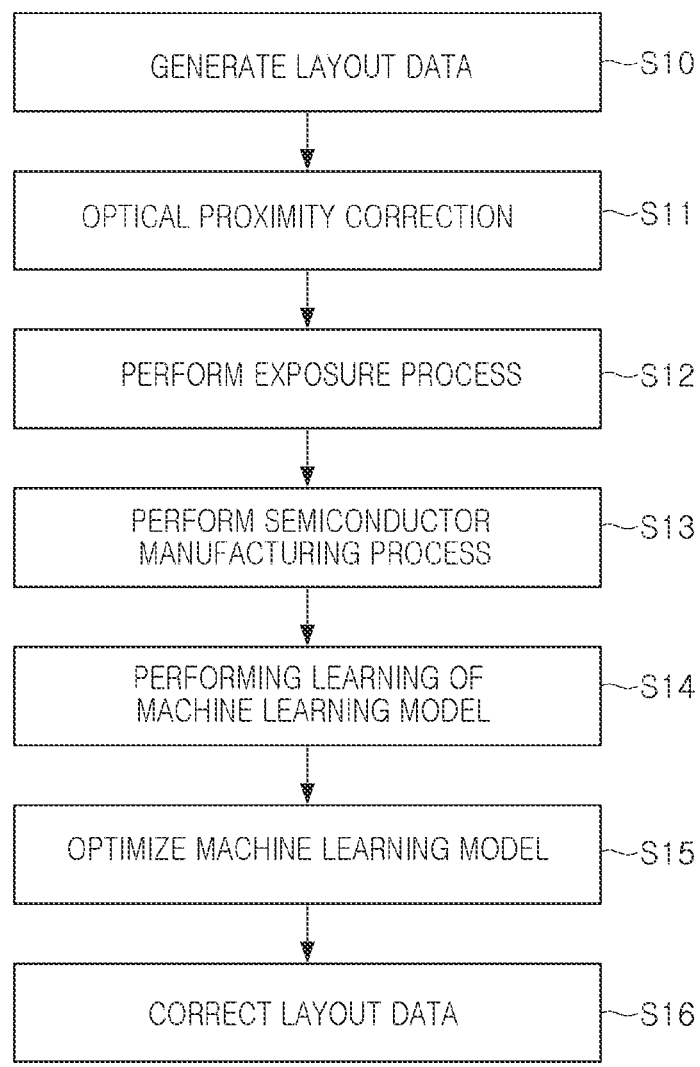
FIG. 3 is a flowchart illustrating a proximity correction method for semiconductor manufacturing processes according to some example embodiments.

FIG. 3 is a flowchart illustrating a proximity correction method for a semiconductor manufacturing process according to some example embodiments.

Referring to FIG. 3, a semiconductor manufacturing process according to some example embodiments may start with generation of layout data (S10). As an example, the operation S10 may include an operation such as place and route (PnR) for selecting and placing at least some standard cells, among standard cells stored in a library, and designing interconnections for connecting elements included in the standard cells. When the layout data is generated, mask data may be generated by performing optical proximity correction for compensating for an optical proximity effect occurring in an exposure process (S11).

When the mask data is generated, an exposure process may be performed using the mask data (S12), and a mask layer may be formed by the exposure process. A semiconductor manufacturing process such as an etching process, a deposition process, a polishing process, or the like, may be performed using the mask layer (S13). As an example, in an etching process, a region exposed by the mask layer may be selectively removed during the semiconductor manufacturing process.

When the semiconductor manufacturing process is finished, learning for a machine learning model to estimate prediction values for critical dimensions of patterns may be performed (S14). As an example, the machine learning model may include a convolution neural network. In some example embodiments, the machine learning model may receive image data obtained by converting layout data into an image format, and may output prediction values for critical dimensions of target patterns included in the image data. As an example, image data input to the machine learning model may be obtained using the layout data generated in S10.

The machine learning model may perform learning using a prediction value that is output from the machine learning model, and a result value of a critical dimension of actual patterns measured from a semiconductor substrate. The actual patterns may be patterns formed on a semiconductor substrate by the semiconductor manufacturing process performed in operation S13, and may correspond to the target patterns included in the image data input to the machine learning model. As an example, when the machine learning model outputs a prediction value for the critical dimension of the target pattern as 'A' and the critical dimension of the actual pattern corresponding to the target pattern is measured as 'B' different from 'A', the machine learning model may perform learning until 'A' and 'B' match each other or a difference between 'A' and 'B' is less than or equal to a predetermined reference difference. Accordingly, in some example embodiments, the performing of learning (or operations thereof) may be performed one or more times.

When the learning of the machine learning model is finished, optimization of the machine learning model may be performed (S15). As an example, when the critical dimension of the target pattern included in the layout data is changed by 'X' using a machine learning model which has been learned, the critical dimension of the actual pattern formed on the semiconductor substrate by the semiconductor manufacturing process may be changed by 'Y' different from 'X'. In S15, sensitivity of the machine learning model may be determined using the degree of change of the critical dimension of the target pattern in the layout data and the degree of change of the critical dimension of the actual pattern, and optimization of the machine learning model may be performed.

When the optimization of the machine learning model is finished, the layout data may be corrected using the machine learning model (S16). As an example, when the critical dimension of the actual pattern is desired to be changed by 'Z', the critical dimension of the target pattern in the layout data may be changed by a value different from 'Z', for example, a value reflecting the sensitivity in 'Z'.

Figure 4:
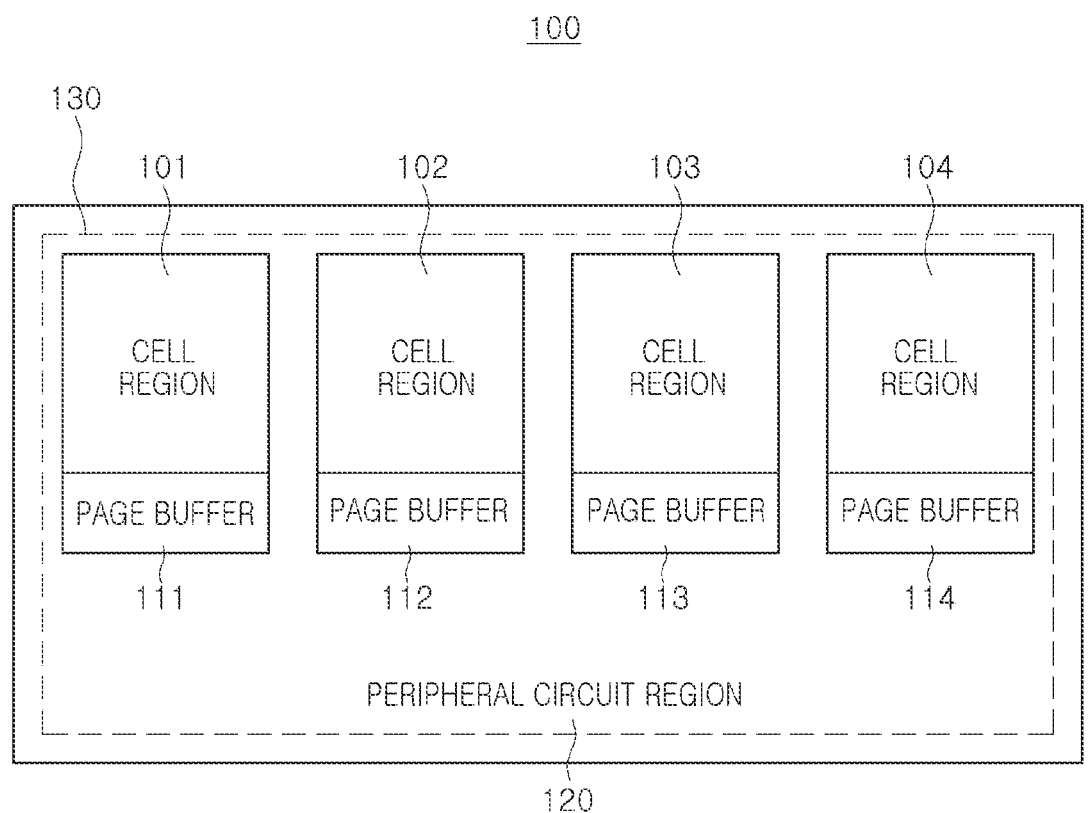
FIGS. 4 and 5 illustrate a semiconductor device according to some example embodiments.
Figure 5:
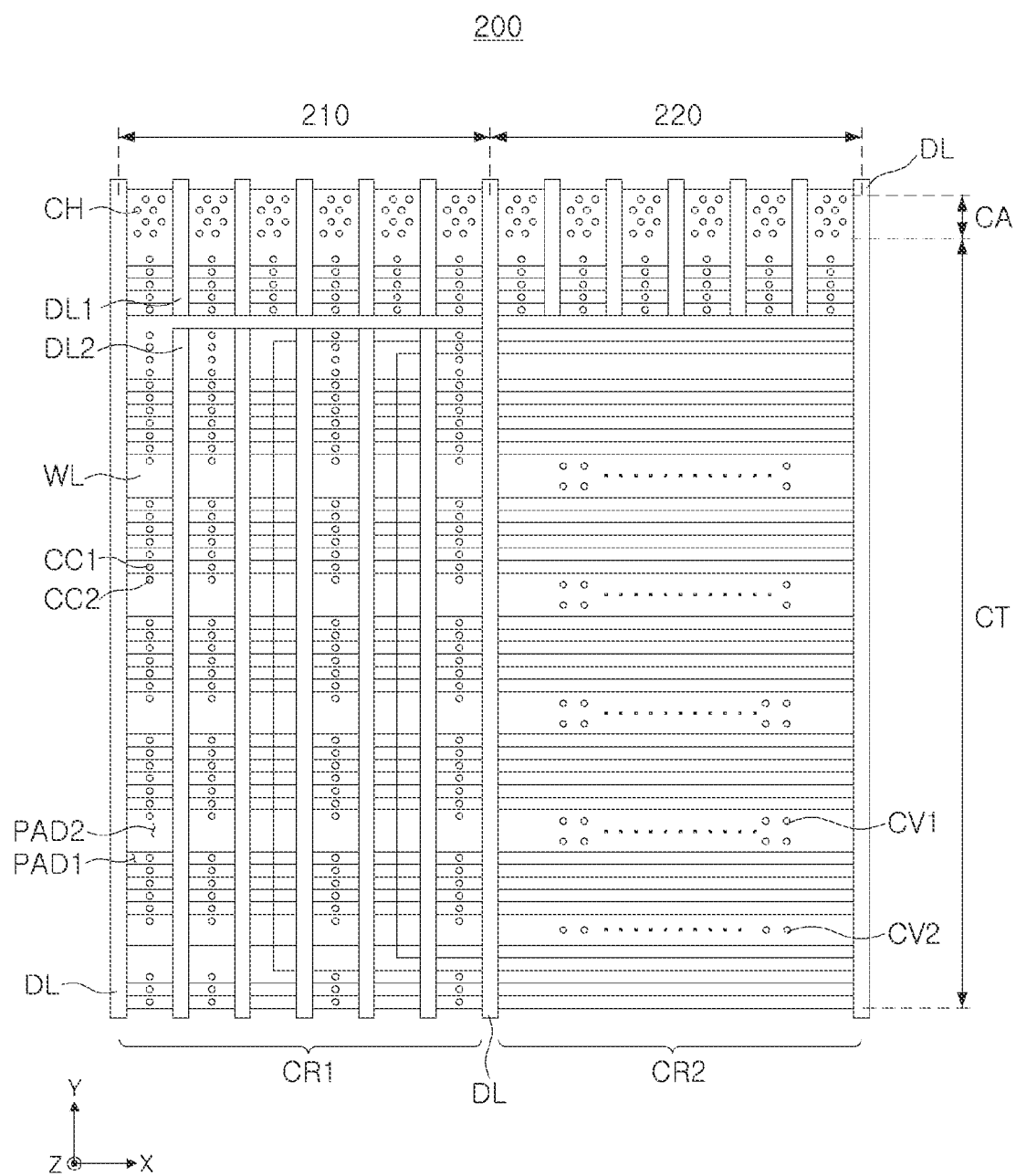

FIGS. 4 and 5 illustrate a semiconductor device according to some example embodiments.

The semiconductor devices 100 and 200 according to the example embodiments described with reference to FIGS. 4 and 5 may be memory devices capable of storing data and/or configured to store data. Referring to FIG. 4, the semiconductor device 100 may include cell regions 101 to 104, page buffers 111 to 114, and a peripheral circuit region 120, although other components may be present in the semiconductor device 100 but not shown in FIG. 4 for convenience of description. Each of the cell regions 101 to 104 may be a unit region defined as a mat or a plane. Each of the cell regions 101 to 104 may be subdivided into a plurality of blocks and a plurality of pages. The cell regions 101 to 104 may include a plurality of memory cells. The page buffers 111 to 114 may be respectively connected to the cell regions 101 to 104 through conductive lines, and may be configured to read data stored in the memory cells of the respective cell region 101 to 104 or write data to the memory cells of the respective cell region 101 to 104.

The peripheral circuit area 120 may include circuits required for operation of the semiconductor device 100. For example, when the semiconductor device 100 is a flash memory device, the peripheral circuit region 120 may include a clock generation circuit, an interface circuit, a power generation circuit, a row decoder, a column decoder, and the like.

Layout data for a selected region 130 of the semiconductor device 100 may be input to a machine learning model for proximity correction of a semiconductor manufacturing process. The machine learning model may receive image data generated from the layout data for the selection region 130, and may output prediction values for critical dimensions of target patterns included in the layout data. In addition, after a semiconductor manufacturing process using the layout data is finished, measurement values for the critical dimensions of actual patterns included in the selection region 130 may be obtained using a predetermined device. The measured value may be a value obtained by performing a measurement (e.g., performing an actual measurement) of the critical dimensions of actual patterns formed in the selection region 130 by a semiconductor manufacturing process. The machine learning model may perform learning using the prediction value and the measured values. As an example, the measured value may be a width measured in a specific location of each of the actual patterns, or may be an average value of widths measured in the actual patterns.

The target patterns may be variously selected. As an example, the target patterns may be contacts connected to semiconductor elements in the selected region 130. Alternatively, a gate pattern for implementing the semiconductor elements in the selected region 130 or active patterns providing a source/drain region may be selected as the target patterns.

FIG. 5 illustrates a memory device 200, which may be used to implement at least some of the cell regions 101 to 104 shown in FIG. 4. Referring to FIG. 5, the memory device 200 may include a first memory block 210 and a second memory block 220. Each of the first memory block 210 and the second memory block 220 may include a cell array region CA, a cell contact region CT adjacent to the cell array area CA, and the like. The first memory block 210 and the second memory block 220 may be adjacent to each other.

The cell contact region CT may include a first connection region CR1 and a second connection region CR2. First pads PAD1 and second pads PAD2 may be formed in the first connection region CR1 and the second connection region CR2. As an example, in the first connection region CR1, the first pads PAD1 and the second pads PAD2 may form steps in a first direction and a second direction, and in the second connection region CR2, the first pads PAD1 and the second pads PAD2 may form steps in the first direction.

The second pads PAD2 may have a larger area than the first pads PAD1. For example, the second pads PAD2 may extend or elongate further than the first pads PAD1 in a first direction (e.g., an X direction). The first pads PAD1 and the second pads PAD2 illustrated in FIG. 5 are just exemplary, and a length of each of the first pads PAD1 and the second pads PAD2 may be variously changed. As an example, the length of each of the second pads PAD2 may be 10 times or more the length of each of the first pads PAD1 in the first direction.

The first memory block 210 and the second memory block 220 may include a plurality of word lines WL stacked on each other, and a plurality of channel structures CH may be provided to penetrate through the word lines WL in the cell array region CA. The plurality of word lines WL may be divided into a first memory block 210 and a second memory block 220 by separation layers DL.

First separation regions DL1 and second separation regions DL2 may be provided between the separation layers DL closest to a second direction (an X-axis direction). The first separation regions DL1 may be formed over the cell array region CA and the cell contact region CT, and the second separation regions DL2 may be formed only in the cell contact region CT. In some example embodiments, and as illustrated in FIG. 5, the second separation regions DL2 may not be formed in the second connection region CR2.

In the first pads PAD1 and the second pads PAD2 formed in the first connection region CR1, word lines WL may be connected to cell contacts CC1 and CC2. At least some of the cell contacts CC1 and CC2 may be connected to at least some of a plurality of vertical vias CV1 and CV2 formed in the second connection region CR2. The vertical vias CV1 and CV2 may be connected to the cell array region CA and circuit elements below the cell contact region CT in the second connection region CR2. As an example, the vertical vias CV1 and CV2 may be connected to pass elements below the cell contact region CT.

As described above, the second separation regions DL2 may not be formed in the second connection region CR2. Accordingly, an acid such as phosphoric acid may be introduced through trenches, provided to form the separation layers DL, the first separation regions DL1 and the second separation regions DL2, so that a process of replacing sacrificial layers with word lines WL may not be performed in at least a portion of the second connection region CR2. The vertical vias CV1 and CV2 may extend in a third direction (e.g., a Z-axis direction) in a region, in which the word lines WL are not formed and the sacrificial layers remain, to be connected to lower pass elements.

The cell contacts CC1 and CC2 may include first cell contacts CC1, arranged on the first pads PAD1, and second cell contacts CC2 arranged on the second pads PAD2. Since the first pads PAD1 and the second pads PAD2 have different areas, a relationship between other neighboring cell contacts CC1 and CC2 included in each of the first cell contacts CC1 may be different from a relationship between other neighboring cell contacts CC1 and CC2 included in the second cell contacts CC2. As an example, unlike the first cell contacts CC1, at least some of the second cell contacts CC2 may not be adjacent to the other cell contacts CC1 and CC2 in one side in the first direction. Therefore, even when the cell contacts CC1 and CC2 are formed based on layout data in which critical dimensions of the cell contacts CC1 and CC2 are designed as a single value, the first cell contacts CC1 and the second cell contacts CC2 may be formed to have different critical dimensions.

A similar issue may also occur in the vertical vias CV1 and CV2. As an example, at least one of the second pads PAD2 may have an area different from an area of each of the other second pads PAD2. In some example embodiments, and as illustrated in FIG. 5, the first vertical vias CV1 arranged on the second pad PAD2 may have a relatively large area, and second vertical vias CV2 arranged on the second pad PAD2 may have a relatively small area, and the first vertical vias CVA and the second vertical vias CV2 may be formed to have different critical dimensions.

As described above, in some example embodiments, sample regions in which a portion of the layout data for forming cell contacts CC1 and CC2 and/or vertical vias CV1 and CV2 is selected may be converted into image data and the image data may be input to a machine learning model to perform learning for the machine learning model. The machine learning model may output prediction values for critical dimensions of the cell contacts CC1 and CC2 and/or the vertical vias CV1 and CV2 formed when a semiconductor manufacturing process is performed based on the layout data. The machine learning model may perform learning using the prediction values as well as result values of the critical dimensions of the cell contacts CC1 and CC2 and/or the vertical vias CV1 and CV2 formed by performing a semiconductor manufacturing process.

When the learning is finished, the layout data may input to the machine learning model and the machine learning model may output a prediction value for the critical dimension of each of the cell contacts CC1 and CC2 and/or the vertical vias CV1 and CV2. The prediction values, output from the machine learning model, may be used to modify layout data. As an example, when the prediction value obtained by inputting the corrected layout data again to the machine learning model falls within a predetermined range based on a target value of the critical dimension, an etching process may be performed to form the cell contacts CC1 and CC2 and/or the vertical vias CV1 and CV2. In the same manner as described above, a distribution of the critical dimensions of the cell contacts CC1 and CC2 and/or the vertical vias CV1 and CV2 may be significantly reduced.

Figure 6A:
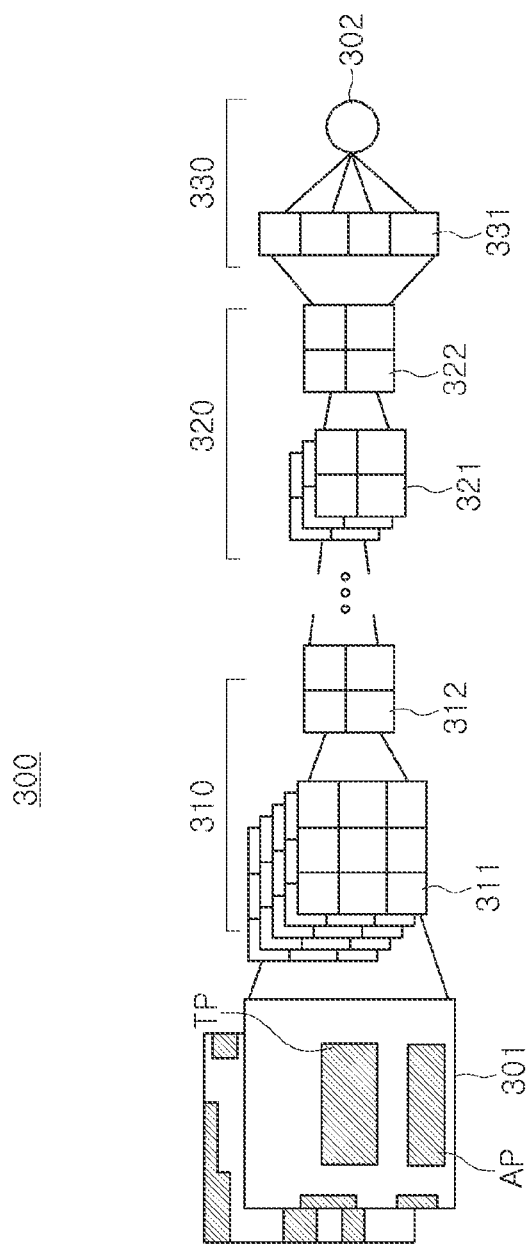
FIGS. 6A to 6C illustrate a machine learning model applied to a proximity correction method for semiconductor manufacturing processes according to some example embodiments.
Figure 6B:
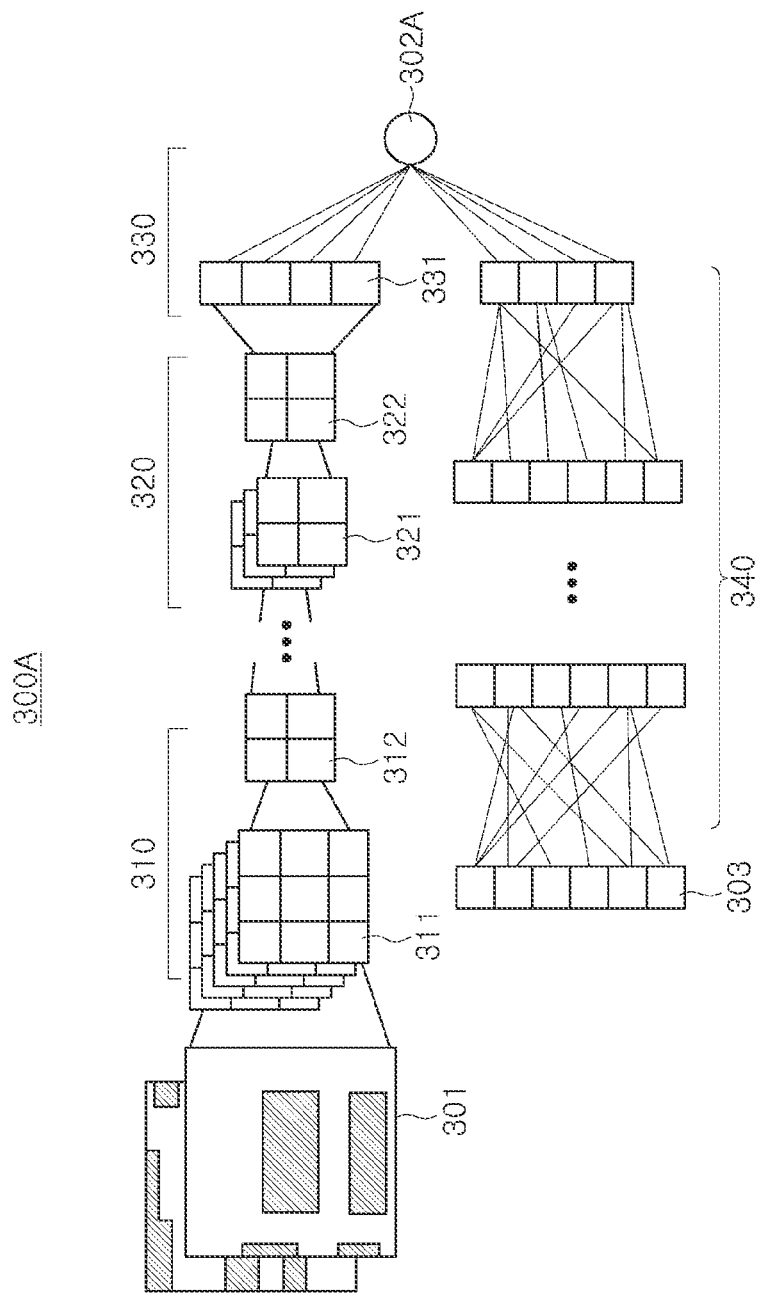
Figure 6C:
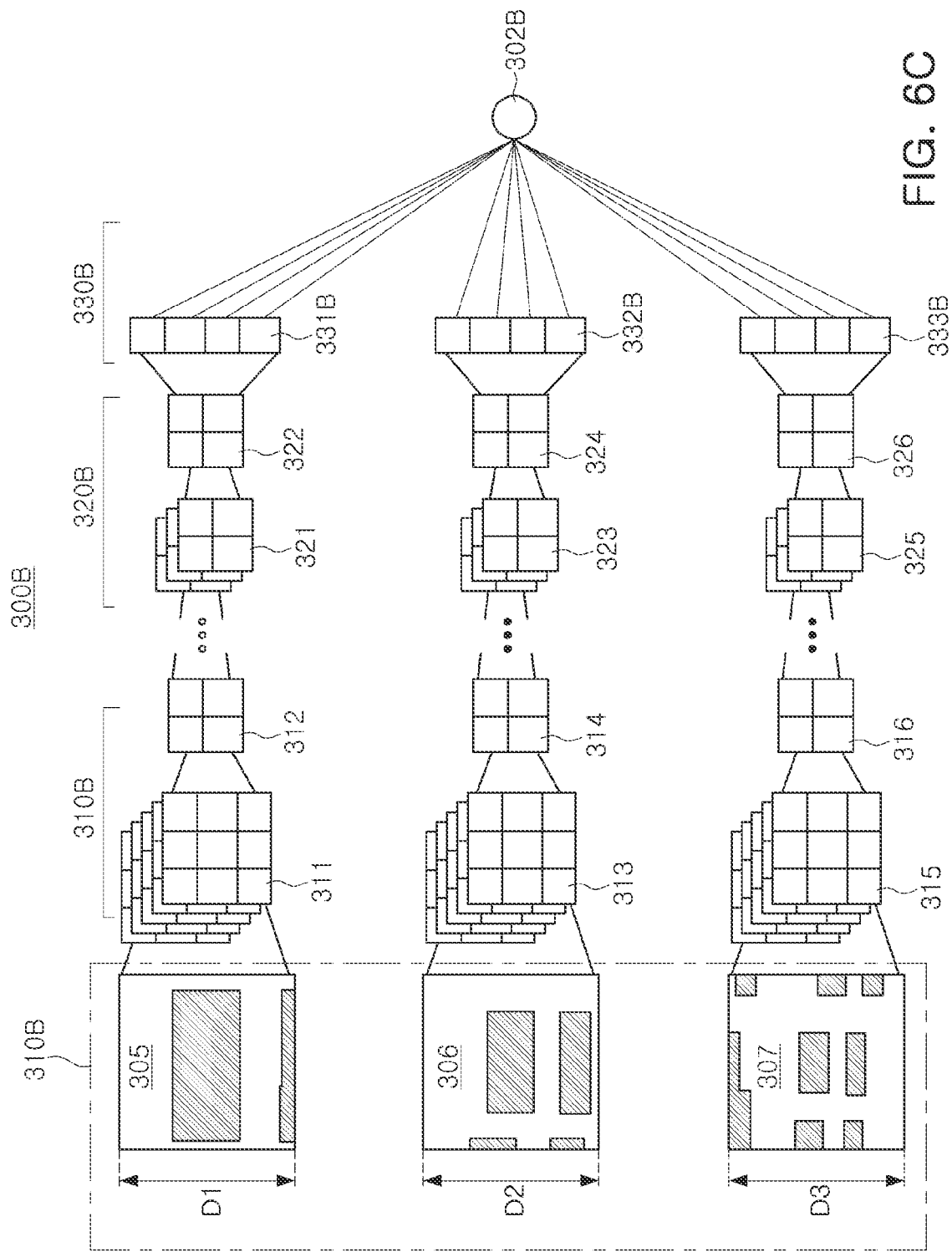

FIGS. 6A to 6C illustrate examples of machine learning models applied to a proximity correction method for a semiconductor manufacturing process according to some example embodiments.

Referring to FIGS. 6A to 6C, machine learning models 300, 300A, and 300B, which may be applied to a proximity correction method according to some example embodiments, may include a convolution neural network. The convolution neural network may include a single or a plurality of convolutional layers and a general artificial neural network layer, and pre-processing may be performed in the convolutional layer.

Referring to FIG. 6A, a machine learning model 300 may include a plurality of convolution layers 310 and 320, and a fully connected layer 330 processing outputs of the plurality of convolutional layers 310 and 320, although other components may be present in the machine learning model 300 but not shown in FIG. 6A for convenience of description. The convolution layers 310 and 320 may include convolution modules 311 and 321 and sub-sampling modules 312 and 322, respectively, as well as other components not shown in FIG. 6A. The convolution modules 311 and 321 may apply one or more kernels to a received feature map to perform a convolution operation, and may apply an activation function such as ReLU to a result of the convolution operation to convert values of the feature map into nonlinear values. The sub-sampling modules 312 and 322 may perform sub-sampling to reduce a size of the feature map output from the convolution modules 311 and 321. The sub-sampling modules 312 and 322 may also be defined as a pooling module. As an example, the sub-sampling modules 312 and 322 may perform operations such as max pooling for selecting a maximum value from the feature map, average pooling for calculating an average from the values of the feature map, and the like.

A plurality of pieces of input image data 301 may be input to the convolutional layers 310 and 320. Each of the plurality of pieces of input image data 301 may be images converted from layout data. Each of the plurality of pieces of input image data 301 may include a target pattern TP to be formed by a semiconductor manufacturing process performed using the layout data, at least one surrounding pattern AP adjacent to the target pattern TP, and the like. A feature map output from the convolution layers 310 and 320 may be input to the fully connected layer 330. As an example, an output value 302 of the fully connected layer 330 may be a prediction value for a critical dimension of the target pattern TP included in one of the input image data 301. The prediction value may be a critical dimension of a target pattern TP predicted when the target pattern TP is actually formed by performing a semiconductor manufacturing process using layout data.

Referring to FIG. 6B, a machine learning model 300A may include convolutional layers 310 and 320, a first fully connected layer 330, a second fully connected layer 340, although other components may be present in the machine learning model 300A but not shown in FIG. 6B for convenience of description. The first fully connected layer 330 may receive feature maps output by the convolutional layers 310 and 320. The second fully connected layer 340 may receive additionally extracted feature values 303. As an example, it may be difficult to extract the convolutional layers 310 and 320 from the plurality of pieces of input image data 301, and values having an effect on the critical dimension of the target pattern TP may be extracted as feature values and the extracted feature values may be input to the second fully connected layer 340.

As an example, when the target pattern TP is a vertical structure extending in a direction perpendicular to a semiconductor substrate, density and critical dimensions of surrounding patterns arranged around the vertical structure may affect a critical dimension of the vertical structure. An area of a portion of the layout data displayed on the plurality of pieces of input image data 301 may be increased to accurately reflect the density of the surrounding patterns. However, in this case, a resolution of each of the target pattern TP and the surrounding patterns may be reduced. Therefore, some of the surrounding patterns that are close to the center of the vertical structure may be generated as input image data 301 and then input to the convolution layers 310 and 320, and a density of surrounding patterns not included in the input image data 301 may be converted into a numerical value and then input to the second fully connected layer 340 as a feature value.

Referring to FIG. 6C, a machine learning model 300B may include convolutional layers 310B and 320B, a fully connected layer 330B, although other components may be present in the machine learning model 300B but not shown in FIG. 6C for convenience of description. In some example embodiments, and as illustrated in FIG. 6C, a plurality of pieces of input image data 301B having different resolutions and sizes may be generated from layout data and then input to the machine learning model 300B. For example, first input image data 305 may be a square image having a corner having a first length D1, and the second input image data 306 may be a square image having a corner having a second length D2 greater than the first length D1. A third input image data 307 may be a square image having a corner having a third length D3 greater than the second length D2. The first input image data, the second input image data, and third input image data 305, 306, and 307 may include the same target pattern.

The first convolution layer 310B may include convolution modules 311, 313, and 315 and sub-sampling modules 312, 314, and 316, respectively processing first input image data, the second input image data, and third input image data 305, 306, and 307. Similarly, the second convolution layer 320B may also include convolution modules 321, 323, 325 and sub-sampling modules 322, 324, respectively corresponding to first input image data, the second input image data, and third input image data 305, 306, and 307. The fully connected layer 330B may process feature maps that are output by the convolution layers 310B and 320B corresponding to first input image data, the second input image data, and third input image data 305, 306, and 307, and may transmit a prediction value for the critical dimension of the target pattern as an output value 302B.

The present disclosure is not limited to the machine learning models described above, and a machine learning model different from the machine learning models 300, 300A, and 300B described with reference to FIGS. 6A to 6C may be applied to the proximity correction method according to some example embodiments. As an example, the second fully connected layer 340, described with reference to FIG. 6B, may be combined with the machine learning model 300B according to the example embodiment illustrated in FIG. 6C.

Figure 7:
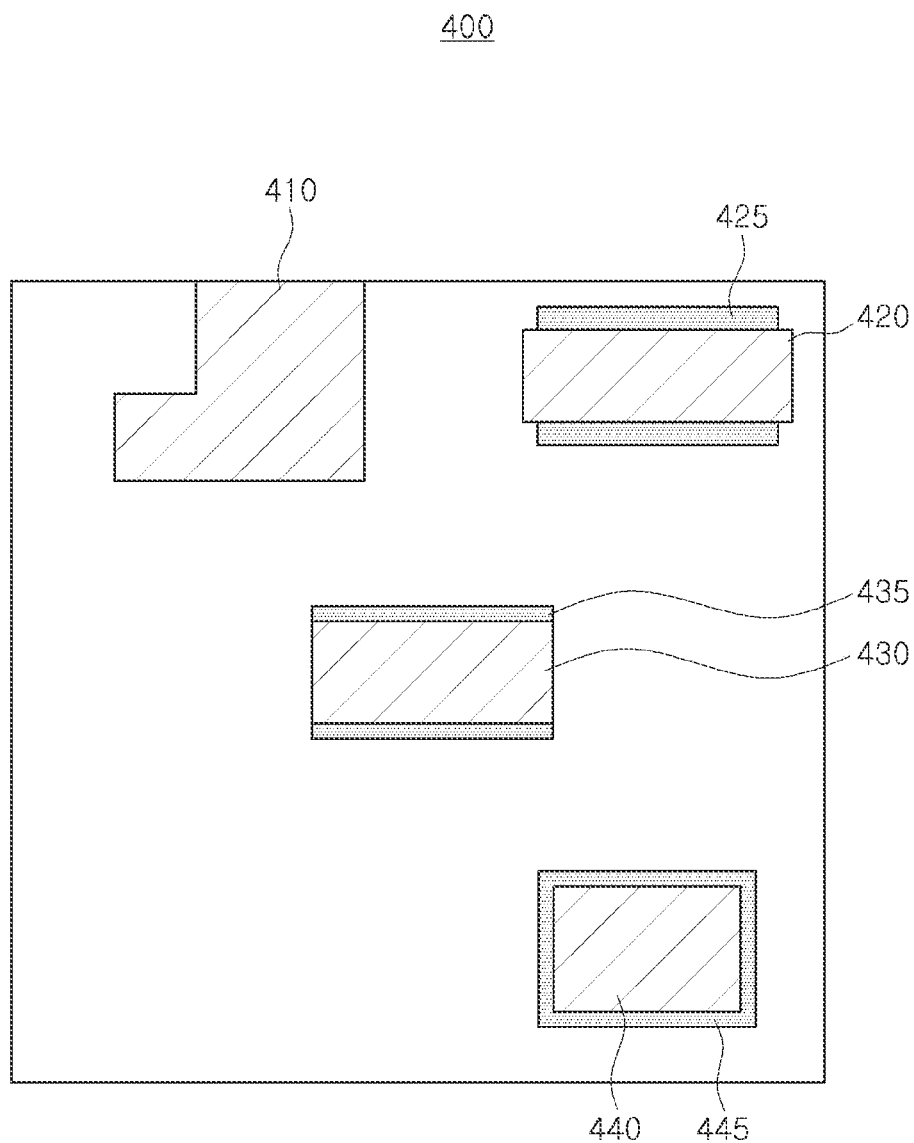
FIG. 7 illustrates a proximity correction method for semiconductor manufacturing processes according to some example embodiments.

FIG. 7 illustrates a proximity correction method for a semiconductor manufacturing process according to some example embodiments.

FIG. 7 may be a view illustrating a portion of layout data 400 for performing a semiconductor manufacturing process. As described above, when the layout data 400 is input to a machine learning model which has finished learning, the machine learning model may output prediction values for critical dimensions of some patterns, among patterns 410 to 440 included in the layout data 400. When the prediction value is different from a target value for a critical dimension of each of the patterns 410 to 440, the critical dimension of each of the patterns 410 to 440 may be corrected in the layout data 400.

Referring to FIG. 7, the first pattern 410 may correspond to a case in which a prediction value of a critical dimension, output by the machine learning model, matches a target value or falls within a predetermined range based on the target value. Therefore, the first pattern 410 may not be modified. Meanwhile, each of the second to fourth patterns 420 to 440 may be a case in which a prediction value of a critical dimension, output by the machine learning model, does not fall within a predetermined range based on a target value. Therefore, as illustrated in FIG. 7, the critical dimension of each of the second to fourth patterns 420 to 440 may be modified.

As an example, the second pattern 420 may be modified as a new second pattern 425 by decreasing a width thereof in a horizontal direction and increasing a height thereof in a vertical direction. The third pattern 430 may be modified as a new third pattern 435 by increasing only a height thereof, and the fourth pattern 440 may be modified as a new fourth pattern 445 by increasing both a width and a height thereof. The modified layout data 400 may be input to the machine learning model again, and the prediction value of the critical dimension output from the machine learning model may be compared with the target value again. When the prediction value matches the target value or falls within a predetermined range based on the target value, a process may be performed to form patterns based on the modified layout data 400.

Figure 8:
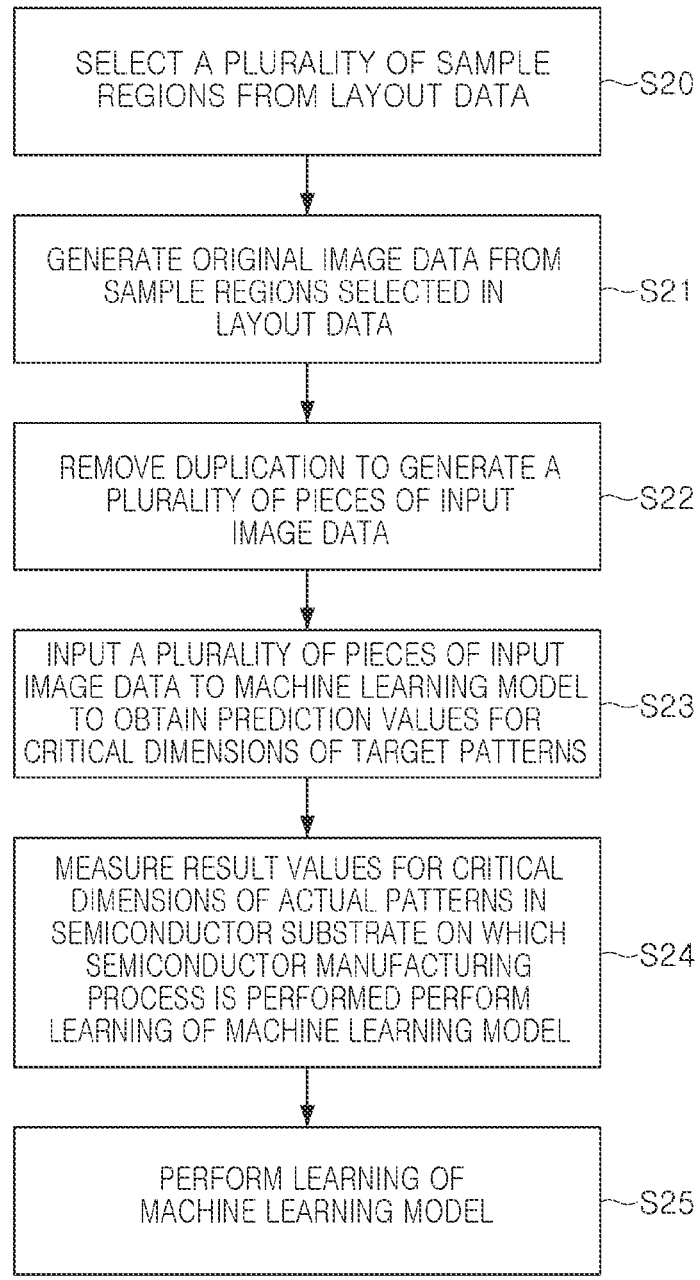
FIG. 8 is a flowchart provided illustrating a method of learning a machine learning model in a proximity correction method for semiconductor manufacturing processes according to some example embodiments.

FIG. 8 is a flowchart provided illustrating a method of learning a machine learning model in a proximity correction method for a semiconductor manufacturing process according to some example embodiments.

Referring to FIG. 8, a method of learning a machine learning model according to some example embodiments may start with selection of a plurality of sample regions from layout data (S20). The layout data may be provided as data in a graphic design system (GDS) format. According to some example embodiments, design rule checking (DRC) for layout data and/or LVS for verifying whether the layout data matches an original intended design may be performed. In addition, layout data for selecting sample regions may be layout data before optical proximity correction is performed.

Layout data may be used for generating a plurality of pieces of original image data (S21). For example, the plurality of pieces of original image data may be generated from the plurality of sample regions selected in the layout data. When the number of selected sample regions is N, N pieces of original image data may be generated. Each of the N pieces of original image data may include at least one target pattern, having a critical dimension to be measured, and a surrounding pattern arranged around the target pattern. At least some of the plurality of pieces of original image data may have different sizes and/or resolutions depending on a type of the machine learning model and/or a learning target. According to embodiments, the entire layout data may be converted into image data, and then sample regions may be selected from the image data to generate a plurality of original image data.

Among the plurality of pieces of original image data, a plurality of pieces of duplicate data may be removed (S22). As an example, when sample regions are randomly selected from the layout data, at least some of the sample regions may include a similar target patterns and a similar surrounding pattern. When a machine learning model performs learning using the same or similar original image data, overfitting may occur in the machine learning model. In some example embodiments, the overfitting may be significantly reduced by removing a plurality of pieces of duplicate original image data, which are the same or similar to each other, among the plurality of pieces of original image data. Input image data may be generated by removing duplication from the original image data.

A plurality of pieces of input image data may be input to the machine learning model, and the machine learning model may output a prediction value for a critical dimension of a target pattern included in each of the input image data (S23). The prediction value output by the machine learning model in S23 may be a critical dimension of each of the target patterns expected to be generated on a semiconductor substrate when a semiconductor manufacturing process is performed using layout data. Then, a semiconductor manufacturing process may be actually performed using the layout data, and a result value for a critical dimension of each of the actual patterns formed on the semiconductor substrate by the semiconductor manufacturing process may be measured (S24). In S24, actual patterns may be formed on the semiconductor substrate, and then data including coordinates of each actual region of the semiconductor substrate corresponding to each sample region of the layout data and a critical dimension of each of the actual patterns formed on the actual regions may be generated. Actual patterns for measuring the critical dimension in S24 may correspond to target patterns having critical dimensions predicted by the machine learning model.

Learning of the machine learning model may be performed using the prediction value that is output by the machine learning model in S23, and the result value measured in S24 (S25). The learning of the machine learning model may be performed until the prediction value and the result value match each other or a difference between the prediction value and the result value is decreased within a predetermined range.

In some example embodiments, the learning of the machine learning model may be performed using a common design value of a critical dimension that target patterns commonly have in layout data, and a difference between result values measured in actual patterns of a semiconductor substrate on which a semiconductor manufacturing process is finished. For example, a target to be achieved using the machine learning model may be a process distribution of a critical dimension of a target pattern. As an example, when the target pattern and the actual pattern are a contact structure, a critical dimension may be a width of the contact structure and critical dimensions of a plurality of contact structures to be formed on the semiconductor substrate may have a single common design value in layout data. Result values may be obtained from the plurality of contact structures formed on the semiconductor substrate, and a difference between each of the result values and the common design value may be calculated to obtain a plurality of difference values. The learning of the machine learning model may be performed such that a distribution of difference values is close to a target distribution. The layout data may be modified using such a machine learning model which has performed learning, and thus, a distribution of critical dimensions of the contact structures included in the layout data may be reduced to be close to the target distribution.

FIGS. 9 to 12 illustrating a method of learning a machine learning model in a proximity correction method for a semiconductor manufacturing process according to some example embodiments.

Figure 9:
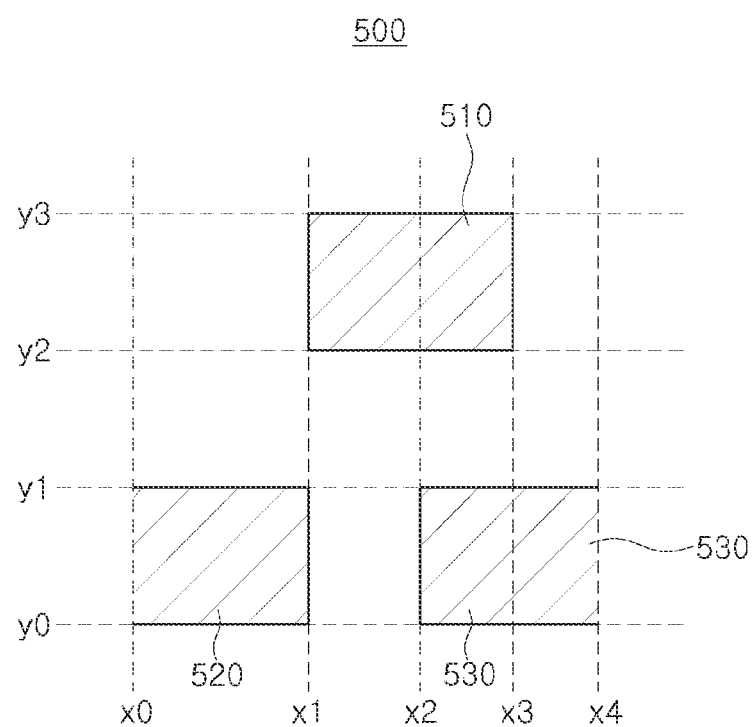
FIGS. 9 to 12 illustrating a method of learning a machine learning model in a proximity correction method for semiconductor manufacturing processes according to some example embodiments.
Figure 10:
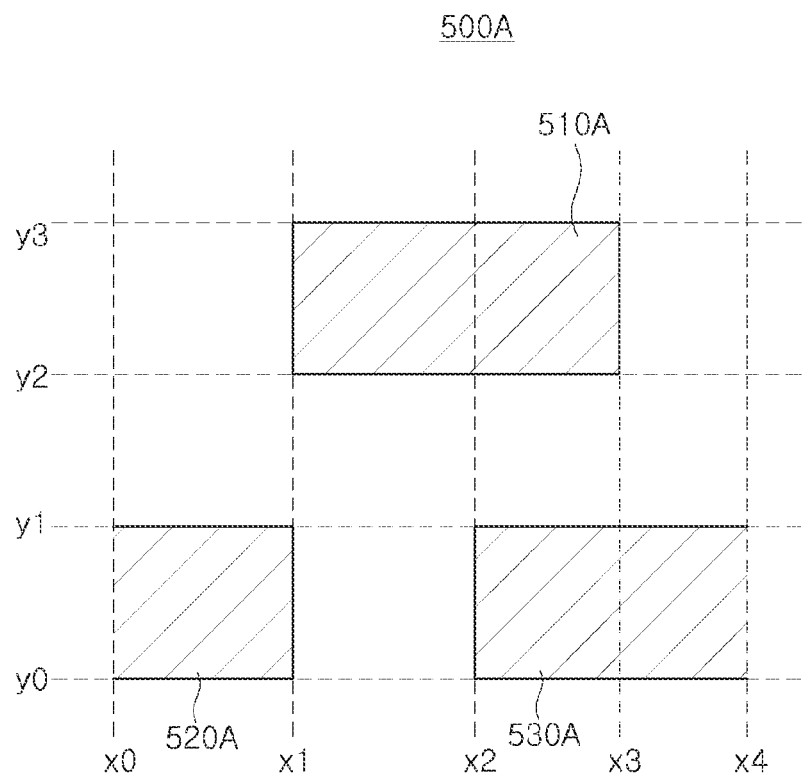

FIGS. 9 and 10 illustrate aspects of a method of removing duplications from a plurality of pieces of original image data 500 and 500A. Referring to FIGS. 9 and 10, patterns 510 to 530 and 510A to 530A included in the plurality of pieces of original image data 500 and 500A may be expressed in a matrix form to remove duplication.

$$T = \begin{bmatrix} 0 & 1 & 1 & 0 \\ 0 & 0 & 0 & 0 \\ 1 & 0 & 1 & 1 \end{bmatrix} \quad \text{Equation 1}$$

As an example, the original image data 500 illustrated in FIG. 9 may be expressed in a matrix T. Each element included in the matrix T indicates presence (1) or absence (0) of the patterns 510 to 530, and rows and columns of each element correspond to a space determined according to boundaries of the patterns 510 to 530 in the original image data 500. As an example, the matrix T may include three rows and four columns, and the three rows correspond to spaces between coordinates y0 to y3 in a y-axis direction and the fourth columns may correspond to spaces between coordinates x0 to x4 in an x-axis direction. Accordingly, a conditional expression for determining a value of each of the elements in the matrix T may be defined by Equation 2 below.

$$\delta x = [x1-x0, x2-x1, x3-x2, x4-x3]$$

$$\delta y = [y1-y0, y2-y1, y3-y2] \quad \text{Equation 2:}$$

The original image data 500A, illustrated in FIG. 10, may also be expressed by the matrix T. However, the patterns 510A to 530A of the original image data 500A, illustrated in FIG. 10, may have sizes different from sizes of the patterns 510 to 530 of the original image data 500 illustrated in FIG. 9. Therefore, as illustrated in FIGS. 9 and 10, when values of the coordinates x0, x4, y0, and y3, differ for original image data 500 and 500A, and accordingly a size of each of the plurality of pieces of original image data 500 and 500A may be different from each other, but the original image data 500 and 500A may be expressed by the same matrix, and duplication removal may be performed to remove the others except for one of the plurality of pieces of the original image data 500 and 500A.

In addition, a method of removing duplication from the plurality of pieces of the original image data may be a method using an image moment. As an example, one or more representative values may be extracted from each of the plurality of pieces of the original image data, and the same or similar portion of the plurality of pieces of original image data may be removed as duplication using the representative values. According to some example embodiments, the representative values may include a plurality of hue moments, and a K-means algorithm may be applied to the representative values, extracted from each of the plurality of pieces of original image data, so that the plurality of pieces of original image data may be clustered to remove the duplication.

Figure 11:
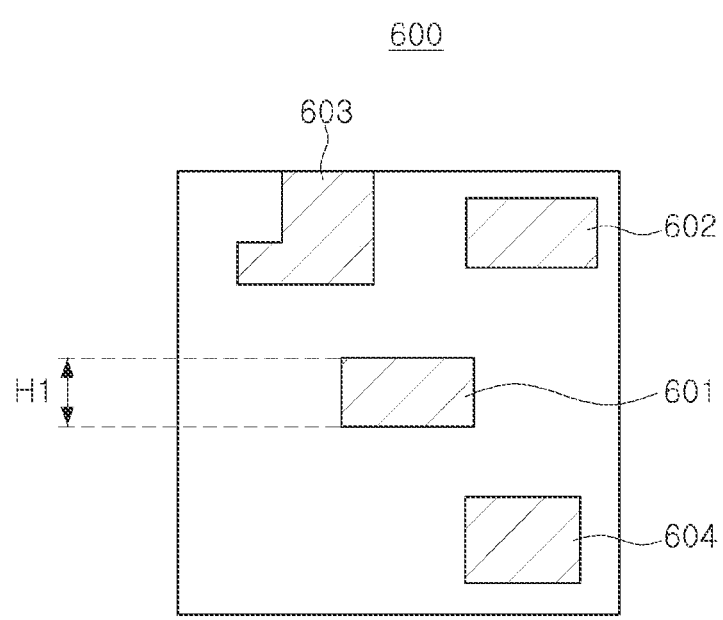
Figure 12:
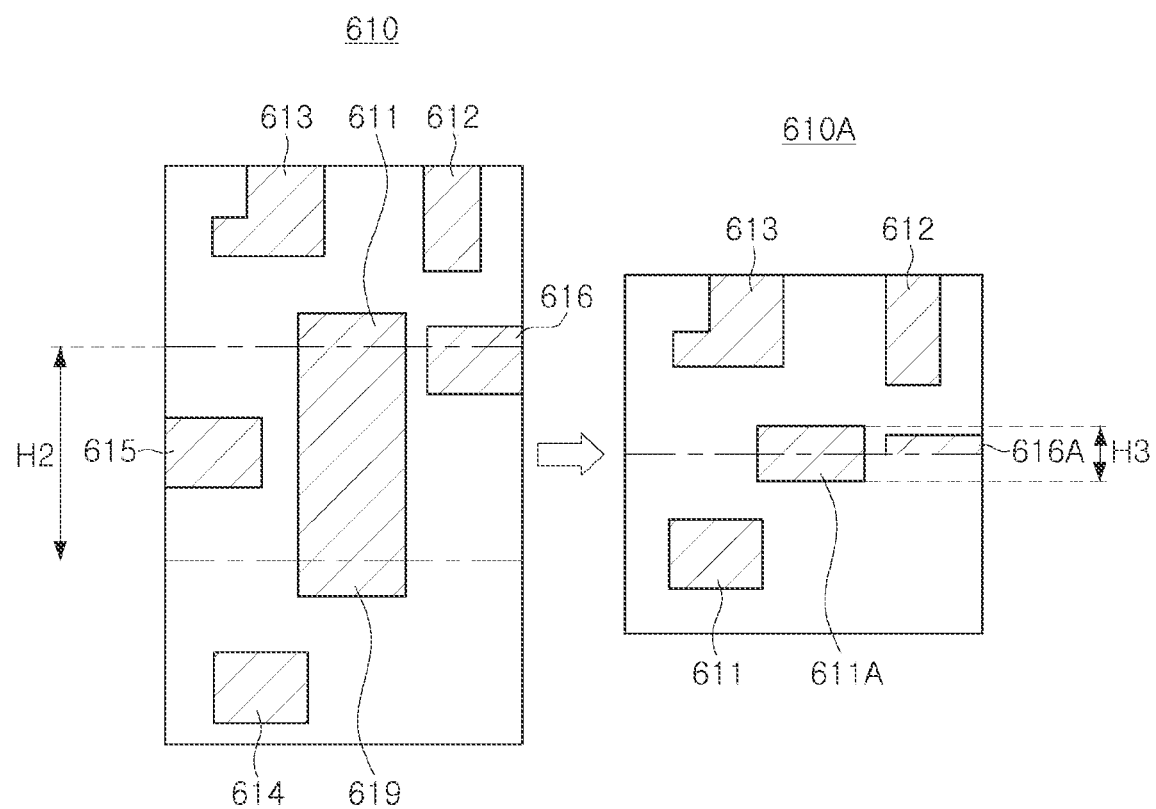

FIGS. 11 and 12 illustrate at least a portion of pre-processing of a plurality of pieces of original image data to generate a plurality of pieces of input image data input to a machine learning model. In some example embodiment, the machine learning model may receive the plurality of pieces of input image data in a square image format having N by N pixels (where N is a positive integer of 2 or more). Therefore, each of the sample regions selected from the layout data may have a square shape.

Referring to FIG. 11, the original image data 600 may include a target pattern 601 and surrounding patterns 602 to 604. In the example embodiment illustrated in FIG. 11, the target pattern 601 may have a first height H1, and the first height H1 may be smaller than a width of a square image format input to the machine learning model. Therefore, the original image data 600 may be used as input image data without additional pre-processing.

Referring to FIG. 12, the target pattern 611 and surrounding patterns 612 to 616 may be included in the original image data 610, and the target pattern 611 may be a target pattern having a second height H2 greater than a width of the square image format in one direction (a vertical direction). Therefore, when the original image data 610 is directly input to the machine learning model as it is without additional pre-processing, the machine learning model may not accurately extract a feature map from the original image data 610.

In some example embodiments, a portion 619 of original image data 610 extracted as a rectangular image may be removed to generate input image data 610A of a square image format. As an example, the removed portion 619 may be selected so as not to include a boundary of the target pattern 611 required to determine a critical dimension of the target pattern 611 in one direction. In the example embodiment illustrated in FIG. 12, the portion 619 may be selected so as not to include boundaries of the target pattern 611 in a horizontal direction.

The target pattern 611A of the input image data 610A may have a third height H3 smaller than a height of the target pattern 611 of the original image data 610. In addition, the removal of the portion 619 may cause at least one 616A of the surrounding patterns 611 to 616 to have a shape and a size varied in the input image data 610A.

Figure 13:
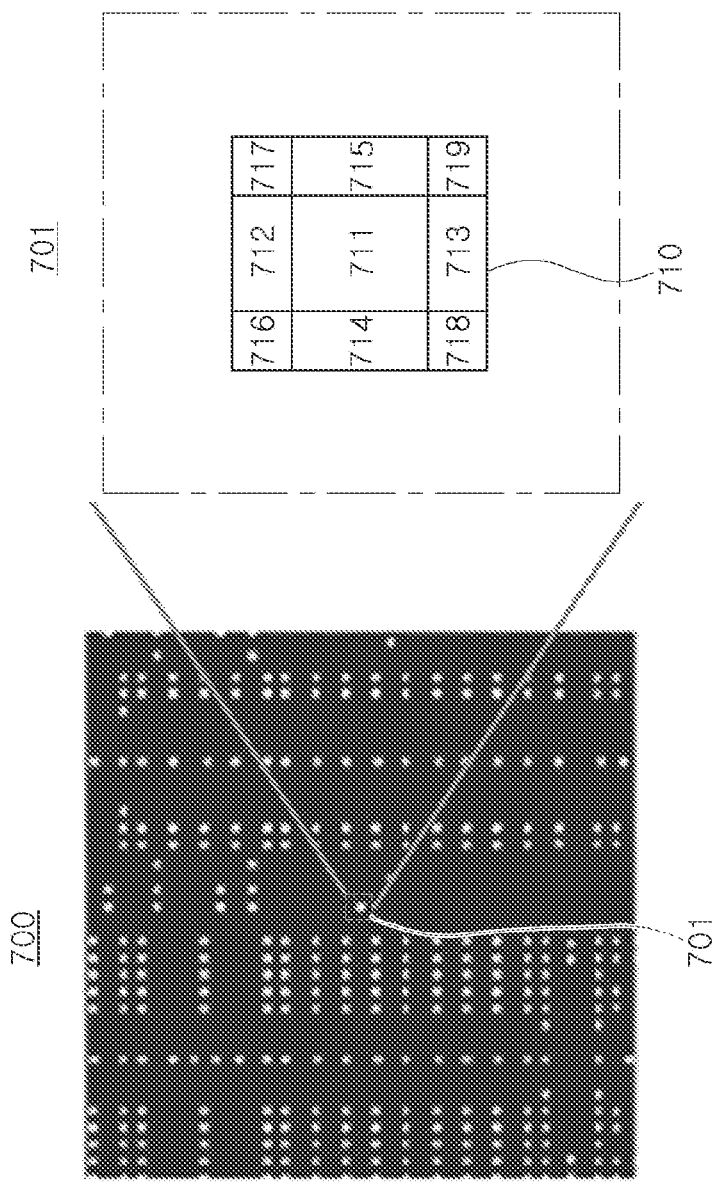
Figure 15:
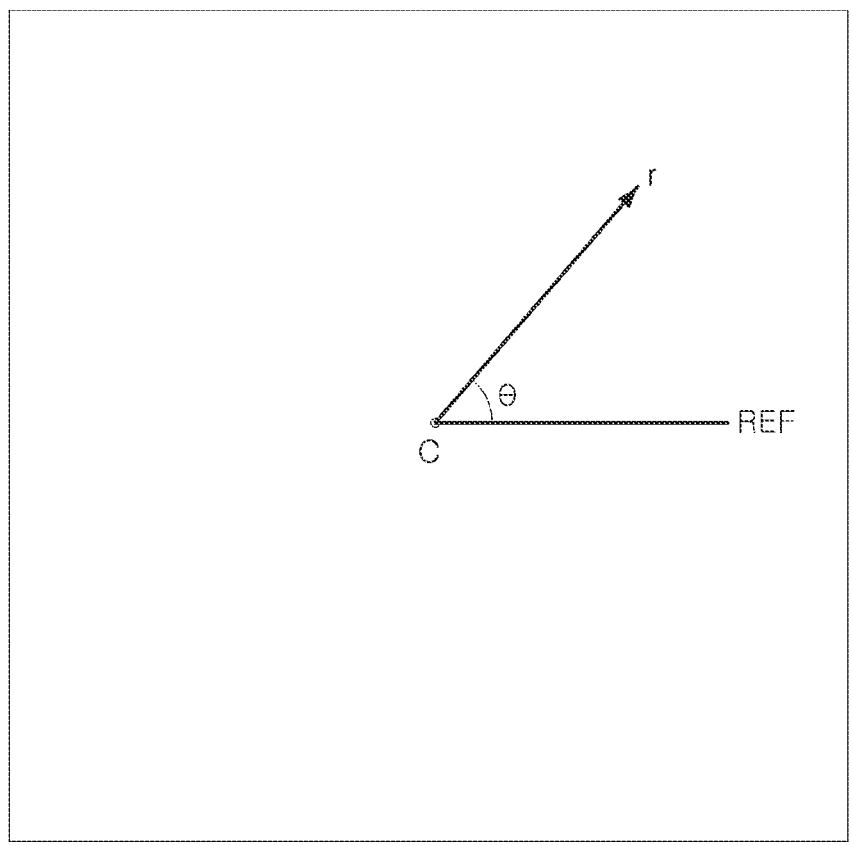

FIGS. 13 to 15 illustrate aspects of a method of learning a machine learning model in a proximity correction method for a semiconductor manufacturing process according to some example embodiments.

As an example, FIGS. 13 to 15 illustrate aspects of methods of addressing an issue in which a machine learning model is biased-learned according to pixel intensity of a plurality of pieces of input image data input to the machine learning model. Referring to FIG. 13, a sample region 701 may be selected from layout data 700 for forming a plurality of patterns, and the sample region 701 may include a target pattern 710. When layout data of the sample region 701 is converted into an image format, the target pattern 710 may be expressed as a plurality of pixels, as illustrated in FIG. 13. Each of the plurality of pixels, expressing the target pattern 710, may be divided into fixed pixels and adjusted pixels according to the degree of overlapping with the target pattern 710.

FIG. 14 may be a view illustrating input image data 720 converted into an image format which may input the sample region 701, described with reference to FIG. 13, to a machine learning model. In the input image data 720, a target pattern 710 may be expressed as pixels arranged in a first direction (a horizontal direction) and a second direction (a vertical direction), intersecting the first direction. As an example, pixels may be expressed by fixed pixels FPX1 to FPX4 and adjusted pixels APX1 to APX12. The fixed pixels FPX1 to FPX4 may completely overlap the target pattern 710. Accordingly, when the input image data 720 is an n-bit image, pixel intensity of each of the fixed pixels FPX1 to FPX4 may be 2n. On the other hand, the adjusted pixels APX1 to APX12 may partially overlap the target pattern 710, and each of the adjusted pixels APX1 to APX12 may have pixel intensity that is greater than 0 and less than 2n.

During learning of the machine learning model, the machine learning model may be biased-learned due to the pixel intensity of each of the adjusted pixels APX1 to APX12 partially overlapping the target pattern 710. In some example embodiments, in order to solve this problem, a data enhancement technique may be applied. As an example, in a data augmentation method according to some example embodiments, data may be augmented in units smaller than a pixel unit.

Referring to FIG. 14, the pixel intensity of each of the adjusted pixels APX1 to APX12 may be determined by horizontal widths HW1 and HW2 and vertical widths VW1 and VW2. Therefore, it will be understood that an area, occupied by the target pattern 710 in each of the adjusted pixels APX1 to APX12 may be determined by the horizontal widths HW1 and HW2 and the vertical widths VW1 and VW2. As an example, the pixel intensity of the first adjusted pixel APX1 may be expressed as follows. In Equation 3, it is assumed that W is a width of a single pixel and the input image data 720 is an 8-bit image.

$$PI_{APX1} = 255 * \frac{HW1}{W} * \frac{VW1}{W} \qquad \text{Equation 3}$$

In some example embodiments of the present disclosure, a data augmentation method may be implemented in such a manner that the first horizontal width HW1 and the second horizontal width HW2 are equivalently increased and decreased to move the target pattern 710 within the original image data 720. As an example, the first horizontal width HW1 may be decreased by an increase in the second horizontal width HW2, or the second horizontal width HW2 may be increased by a decrease in the first horizontal width HW1. Similarly, as an example, the second vertical width VW2 may be decreased by an increase the first vertical width VW1, or the second vertical width VW2 may be increased by a decrease in the first vertical width VW1. As described above, the horizontal widths HW1 and HW2 and the vertical widths VW1 and VW2 may be changed such that the pixel intensity of each of the adjusted pixels APX1 to APX12 may be adjusted to perform augmentation processing on the input image data 720. Before and after the augmentation, a sum of the pixel intensities of the adjusted pixels APX1 to APX12 may be maintained to be constant and the input image data 720 may be augmented to address an issue in which the machine learning model is biased-learned.

FIG. 15 illustrates aspects of a method of adding a separate channel such that a machine learning model may recognize a movement of the center of the target pattern 710 occurring during augmentation of the input image data 720. Referring to FIG. 15, pixel intensities of pixels that may express the target pattern 710 may be represented using polar coordinates (r, θ) based on a reference line REF. As an example, the pixel intensity may be expressed by Equation 4, and a center C of the polar coordinates (r, θ) may be the same as a center C of the target pattern 710.

$$PI = \frac{1}{r^2} \sin\theta \qquad \text{Equation 4}$$

The pixel intensity may be determined based on Equation 4 and center correction data may be generated. The center correction data may indicate a movement of the center of the target pattern 710 occurring during augmentation of the input image data 720. The center correction data may be input to a machine learning model through an additional channel that is different from the input image data 720, and the machine learning model may compensate for coordinates movement of the target pattern 710 based on the augmentation with reference to the center correction data.

FIGS. 16 to 20 illustrate aspects of a method of learning a machine learning model in a proximity correction method for a semiconductor manufacturing process according to some example embodiments.

Figure 16:
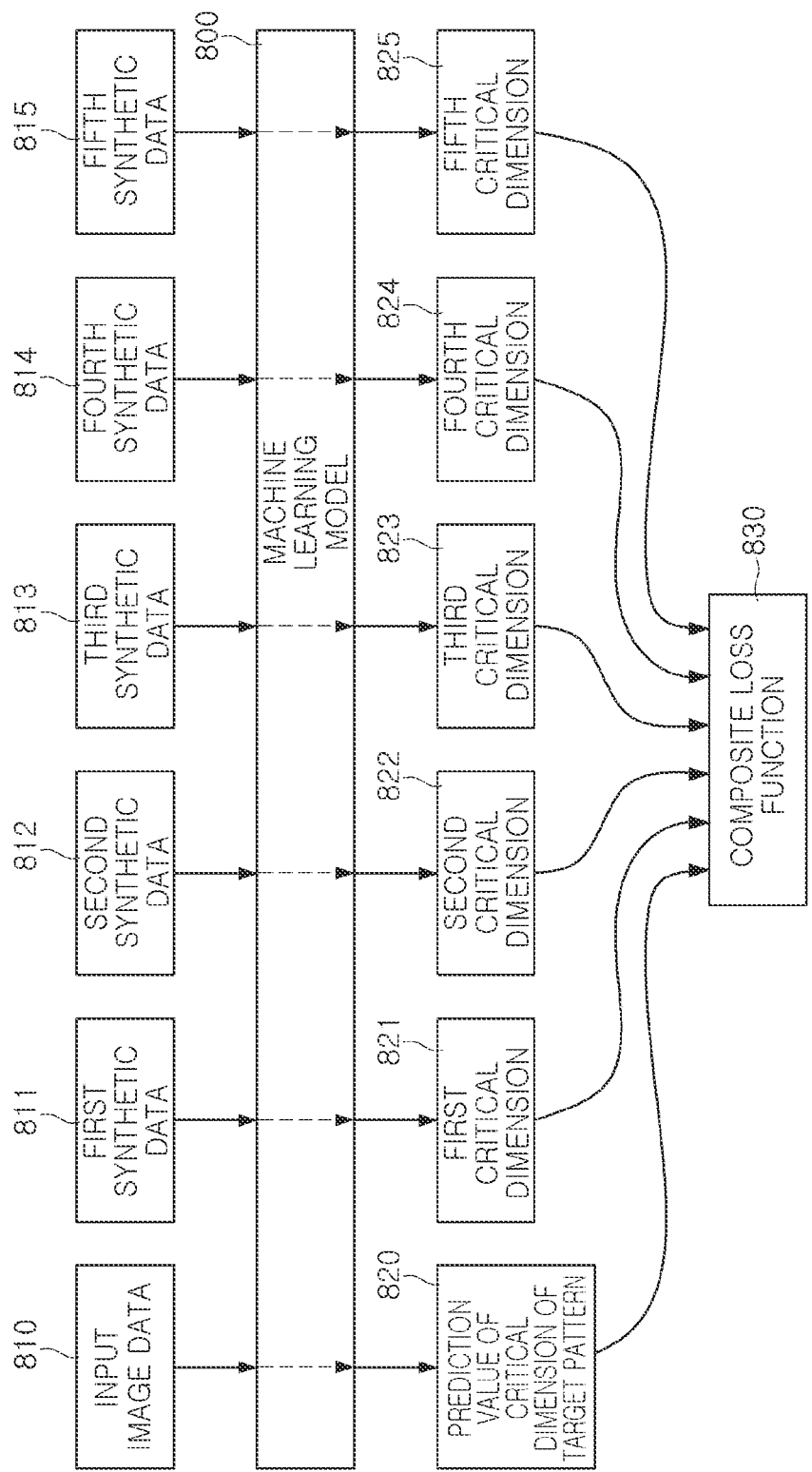
FIGS. 16 to 20 illustrate a method of learning a machine learning model in a proximity correction method for semiconductor manufacturing processes according to some example embodiments.

As an example, FIGS. 16 to 20 illustrating aspects of a method of increasing learning accuracy of a machine learning model 800 using a loss function. Referring to FIG. 16, input image data 810 may be input to the machine learning model 800 to obtain a prediction value 820 for a critical dimension of a target pattern. The input image data 810 may be generated by converting layout data into an image format and removing duplication. As described above, a critical dimension of an actual pattern corresponding to the target pattern may be measured to obtain a result value on a semiconductor substrate, on which a semiconductor manufacturing process may be finished using layout data, and a prediction value 820 may be compared with the result value to perform learning of a machine learning model 800. The comparison between the prediction value 820 and the result value may be performed using a loss function.

When the comparison between the prediction value 820 and the result value is performed using the loss function and the learning of the machine learning model 800 is performed, the machine learning model 800 may output a prediction value 820 different from an already known tendency. For example, when surrounding patterns are arranged left and right around a first target pattern and surrounding patterns are vertically arranged around a second target pattern designed to have the same critical dimension as the first target pattern, the first target pattern and the second target pattern may have substantially the same critical dimension as a result of a semiconductor manufacturing process. On the other hand, the first target pattern and the second target pattern may be recognized to be different from each other by the machine learning model 800 and the machine learning model 800 may output a prediction value of a critical dimension of the first target pattern and a prediction value of a critical dimension of the second target pattern to be different from each other.

In some example embodiments, a plurality of pieces of synthetic data 811 to 815 may be generated and input to the machine learning model 800, and the machine learning model 800 may be forced not to perform learning (e.g., may not perform learning) in a direction different from an already known tendency using critical dimensions 821 to 825 output for the plurality of pieces of synthetic data 811 to 815. As an example, the machine learning model 800 may generate a composite loss function 830 using critical dimensions 821 to 825 that are output as a response to the plurality of pieces of synthetic data 811 to 815 to improve learning accuracy of the machine learning model 800.

As an example, each of the first synthetic data 811 and the second synthetic data 812 may be image data obtained by modifying only the critical dimension of the target pattern while fixing the number and size of surrounding patterns in the input image data 810. As an example, the first synthetic data 811 may be image data obtained by increasing the critical dimension of the target pattern, and the second synthetic data 812 may be image data obtained by decreasing the critical dimension of the target pattern. Hereinafter, this will be described in more detail with reference to FIG. 17.

Figure 17:
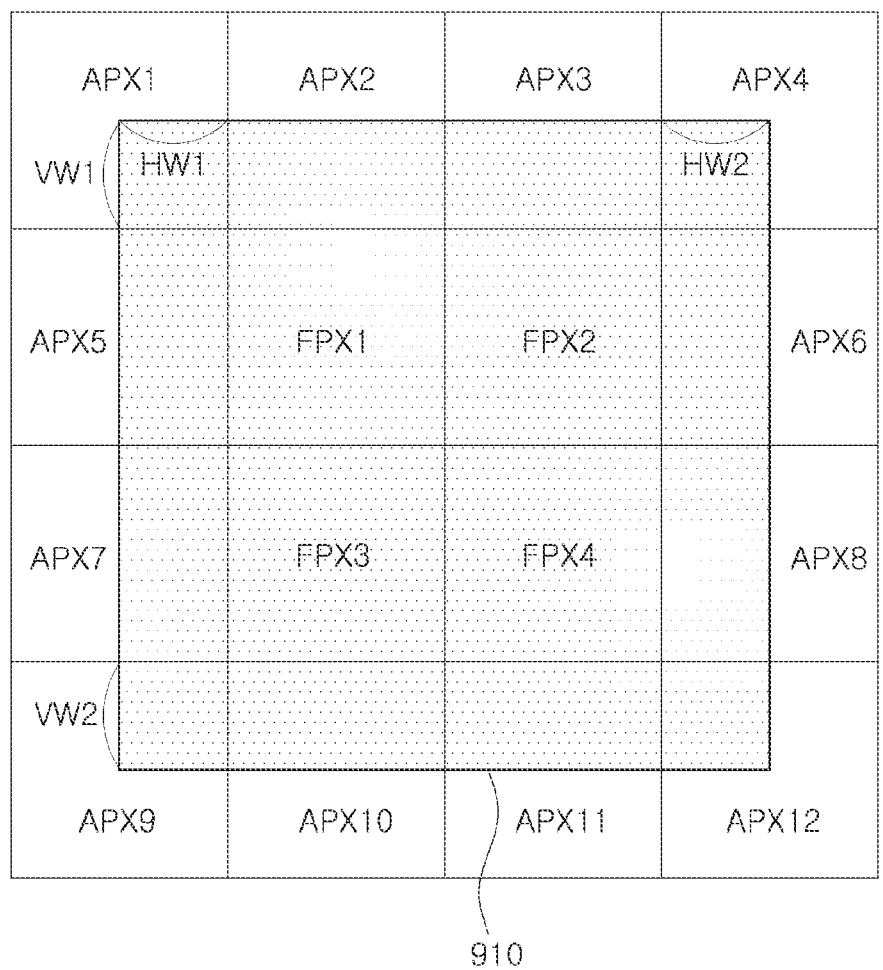

FIG. 17 may illustrate aspects of a method of generating synthetic data by increasing or decreasing a size of a target pattern 910 based on a single piece of input image data 900. Referring to FIG. 17, the input image data 900 may include a target pattern 910. The target pattern 910 may be expressed by a plurality of pixels. The pixels may include fixed pixels FPX1 to FPX4, which may completely overlap the target pattern 910, and adjusted pixels APX1 to APX12, which may partially overlap the target pattern 910. The fixed pixels FPX1 to FPX4 and the adjusted pixels APX1 to APX12 may be understood with reference to the example embodiments described with reference to FIG. 14.

In some example embodiments, in the adjusted pixels APX1 to APX12, at least one of horizontal widths HW1 and HW2 and vertical widths VW1 and VW2 may be increased or decreased to adjust a critical dimension of a target pattern 910 in input image data 900. As an example, the critical dimension of the target pattern 910 in the horizontal direction may be increased by increasing the horizontal widths HW1 and HW2, and the critical dimension of the target pattern 910 in the vertical direction may be decreased by decreasing the vertical widths VW1 and VW2.

Returning to FIG. 16, the machine learning model 800 may output a first critical dimension 821 for the first synthetic data 811 and a second critical dimension 822 for the second synthetic data 812. It will be assumed that the first synthetic data 811 is image data in which the critical dimension of the target pattern is increased in the input image data 810, and the second synthetic data 812 is image data in which the critical dimension of the target pattern is decreased in the input image data 810, although the present disclosure is not limited thereto. Under the assumption, the first critical dimension 821 may be predicted to be larger than the prediction value 820 and the second critical dimension 822 may be predicted to be smaller than the prediction value 820.

When the first critical dimension 821 output from the machine learning model 800 is not greater than the prediction value 820 or the second critical dimension 822 is not smaller than the prediction value 820, learning of the machine learning model 800 may not be performed normally, and prediction accuracy of the machine learning model 800 may be deteriorated after the learning is finished. In some example embodiments, the first critical dimension 821 and the second critical dimension 822 may be reflected in the composite loss function 830. As an example, when the first critical dimension 821 is not larger than the prediction value 820 or the second critical dimension 822 is not smaller than the prediction value 820, the composite loss function 830 may output a large value, which may result in a forcible change to a learning direction of the machine learning model 800.

In some example embodiments, and as illustrated in FIG. 16, third synthetic data 813 and fourth synthetic data 814 may each be data generated by increasing or decreasing a distance from a target pattern to surrounding patterns while fixing a critical dimension of the target pattern. Hereinafter, this will be described in more detail with reference to FIG. 18.

Figure 18:
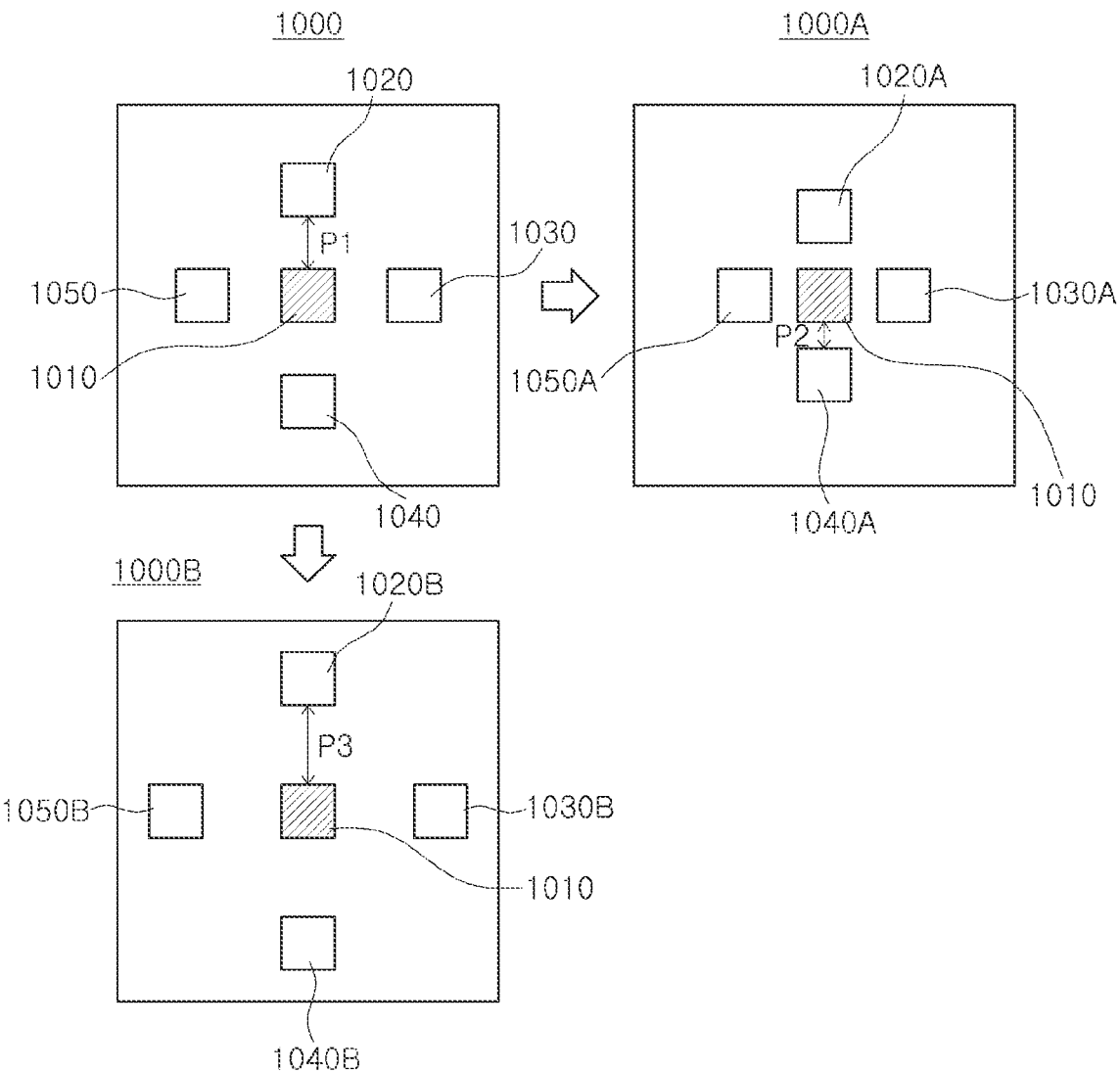

Referring to FIG. 18, input image data 1000 may include a target pattern 1010 and surrounding patterns 1020 to 1050. In the input image data 1000, a distance between the target pattern 1010 and the surrounding patterns 1010 to 1050 may be a first distance P1. According to some example embodiments, the target pattern 1010 may have different gaps from at least some of the surrounding patterns 1010 to 1050.

Referring to FIG. 18, the gap between the target pattern 1010 and the surrounding patterns 1010 to 1050 may be decreased to generate third synthetic data 1000A. In the third synthetic data 1000A, a gap between the target pattern 1010A and the surrounding patterns 1020A to 1050A may be a second interval P2, and the second interval P2 may be smaller than the first gap P1. In addition, a gap between the target pattern 1010 and the surrounding patterns 1010 to 1050 may be increased to generate fourth synthetic data 1000B. In the fourth synthetic data 1000B, a gap between the target pattern 1010B and the surrounding patterns 1020B to 1050B may be a third gap P3, and the third gap P3 may be greater than the first gap P1.

Returning to FIG. 16, the machine learning model 800 may output a third critical dimension 823 for the third synthetic data 813 and a fourth critical dimension 824 for the fourth synthetic data 814. It will be assumed that the third synthetic data 813 is image data obtained by decreasing a gap between the target pattern and the surrounding patterns in the input image data 810, and the fourth synthetic data 814 is image data obtained by increasing a gap between the target pattern and the surrounding pattern in the input image data 810, although the present disclosure is not limited thereto. Under the assumption, the third critical dimension 823 may be predicted to be smaller than the prediction value 820 and the fourth critical dimension 824 may be predicted to be larger than the prediction value 820. Alternatively, the third critical dimension 823 may be predicted to be larger than the prediction value 820 and the fourth critical dimension 824 may be predicted to be smaller than the prediction value 820 according to the target pattern and surrounding patterns.

When both the third critical dimension 823 and the fourth critical dimension 824 are smaller than the prediction value 820 or both the third critical dimension 823 and the fourth critical dimension 824 are greater than the prediction values 820, learning of the machine learning model 800 may not be performed normally, and prediction accuracy of the machine learning model 800 may be deteriorated after the learning is finished. In some example embodiments, the third critical dimension 823 and the fourth critical dimension 824 may be reflected in the composite loss function 830. As an example, when both the third critical dimension 823 and the fourth critical dimension 824 are larger than the prediction value 820 or smaller than the prediction value 820, the composite loss function 830 may output a large value, which may result in a forcible change to a learning direction of the learning model 800.

In some example embodiments, and as illustrated in FIG. 16, the fifth synthetic data 815 may include image data generated by symmetrically moving surrounding patterns while fixing the critical dimension of the target pattern. Hereinafter, this will be described in more detail with reference to FIGS. 19 and 20.

Figure 19:
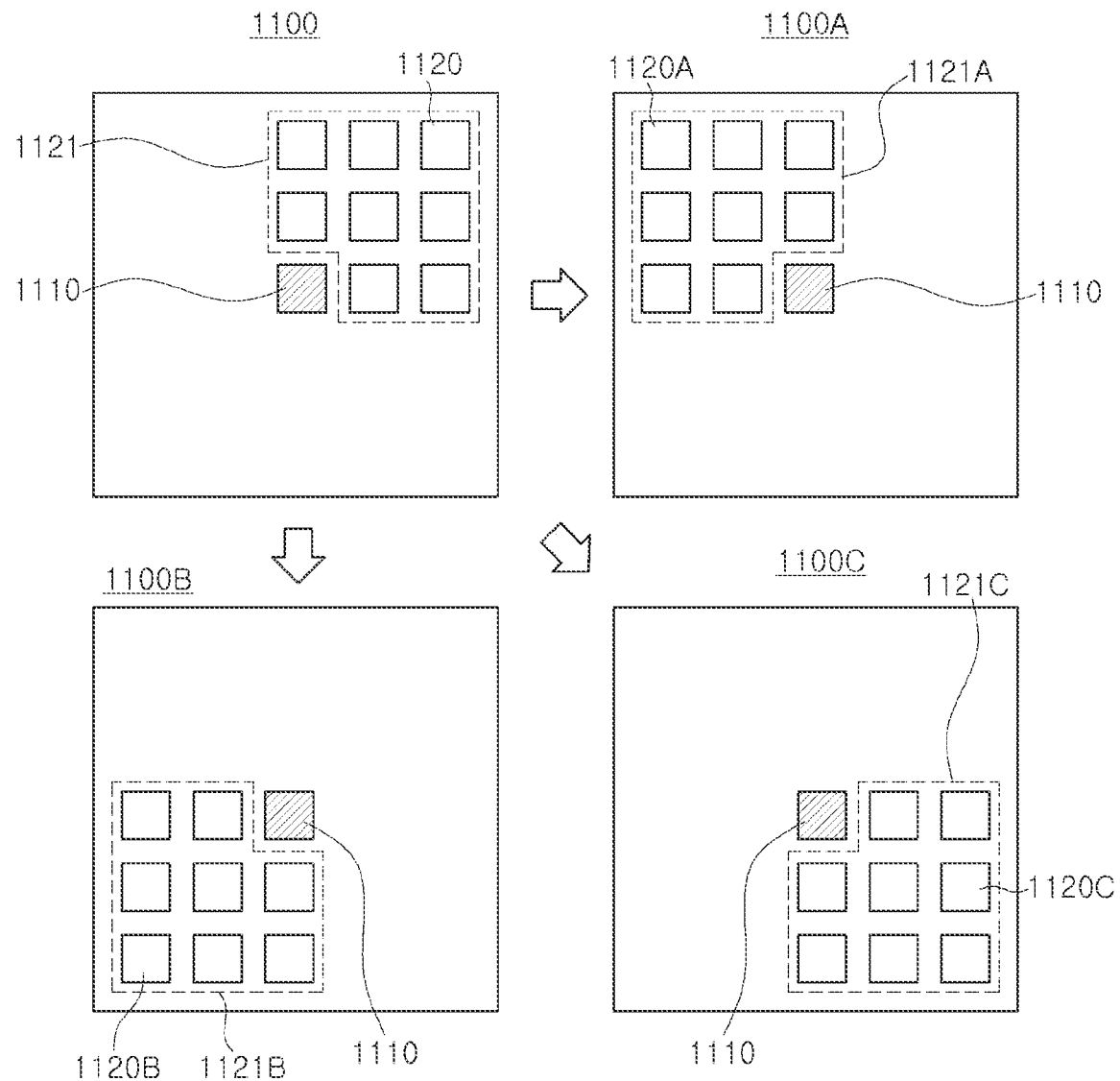

Referring to FIG. 19, input image data 1100 may include a target pattern 1110 and surrounding patterns 1120, and the surrounding patterns 1120 may be arranged in a surrounding pattern region 1121 based on the target pattern 1110. In the input image data 1100, the surrounding patterns 1120 may be arranged on an upper right end of the target pattern 1110.

Referring to FIG. 19, a plurality of pieces of fifth synthetic data 1100A to 1100C may be generated by locating the surrounding patterns 1120 in different regions based on the target pattern 1110. As an example, the plurality of pieces of fifth synthetic data 1100A may be generated by rotating the surrounding patterns 1120 by 90 degrees counterclockwise based on the target pattern 1110 in the input image data 1100. In the plurality of pieces of the fifth synthetic data 1100A, the surrounding patterns 1120A may be arranged in the surrounding pattern region 1121A on a left upper end of the target pattern 1110 based on the target pattern 1110.

In addition, in the input image data 1100, fifth synthetic data 1100B may be generated by rotating the surrounding patterns 1120 by 180 degrees based on the target pattern 1100. In the fifth synthetic data 1100B, surrounding patterns 1120B may be arranged in a surrounding pattern region 1121B on a left lower end of the target pattern 1110. Alternatively, fifth synthetic data 1100C may be generated by rotating the surrounding patterns 1120 by 90 degrees clockwise based on the target pattern 1100 in the input image data 1100. In the fifth synthetic data 1100C, the surrounding patterns 1120C may be arranged in a surrounding pattern region 1121C on a right lower end of the target pattern 1110.

In the input image data 1100 and the plurality of pieces of fifth synthetic data 1100A to 1100C, the target pattern 1110 and the surrounding patterns 1120 and 1120A to 1120C may be arranged to have similar shapes while only directions thereof are different from each other. Therefore, a prediction value of a critical dimension of a target pattern 1110, obtained by inputting the plurality of pieces of fifth synthetic data 1100A to 1100C to the machine learning model, may be predicted to be the same as a target pattern obtained by inputting the input image data 1100 to the machine learning model.

Figure 20:
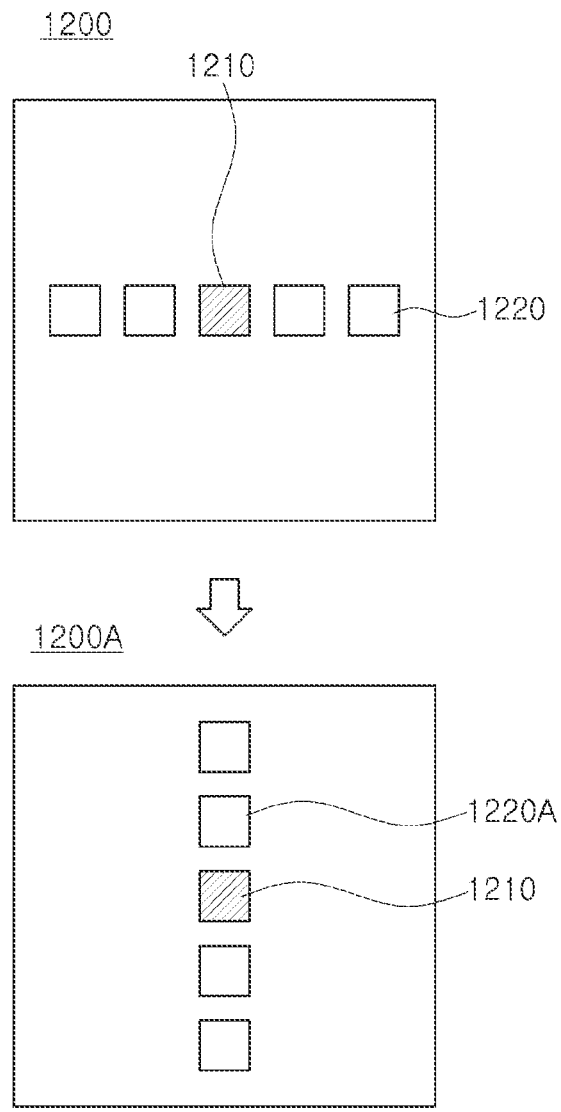

Referring to FIG. 20, input image data 1200 may include a target pattern 1210 and surrounding patterns 1220, and the surrounding patterns 1220 may be arranged above and below the target pattern 1210. In addition, fifth synthetic data 1200A may be generated by locating the surrounding patterns 1220 in different regions based on the target pattern 1210. As an example, the fifth synthetic data 1200A may be generated by rotating the surrounding patterns 1220 clockwise by 90 degrees based on the target pattern 1210 in the input image data 1200, and the surrounding patterns 1220 may be arranged on left and right sides of the target pattern 1210 in the fifth synthetic data 1200A.

Similarly to what is described with reference to FIG. 19, in the input image data 1200 and the fifth synthetic data 1200A, the target pattern 1210 and the surrounding patterns 1220 and 1220A may be arranged to have similar shapes while only directions thereof are different from each other. Accordingly, a prediction value of a critical dimension of the target pattern 1210, obtained by inputting the fifth synthetic data 1200A to the machine learning model, may be predicted to be the same as the target pattern 1210 obtained by inputting the input image data 1200 to the machine learning model.

Returning to FIG. 16, the prediction value 820 obtained by inputting the input image data 810 to the machine learning model 800 and a fifth critical dimension 825 obtained by inputting the fifth synthetic data 815 to the machine learning model 800 may be predicted to be the same. On the other hand, when the prediction value 820 and the fifth critical dimension 825 are different from each other or when the difference therebetween is out of a predetermined reference range, learning of the machine learning model 800 may not be performed normally and prediction accuracy of the machine learning model 800 may be deteriorated after the learning is finished. In some example embodiments, the fifth critical dimension 825 may be reflected in the composite loss function 830. As an example, the composite loss function 830 is a value at which the learning direction of the machine learning model 800 may be forcibly changed when the difference between the fifth critical dimension 825 and the prediction value 820 is out of a predetermined reference range.

In some example embodiments, the composite loss function 830 may include at least one of a first function reflecting the first critical dimension 821 and the second critical dimension 822, a second function reflecting the third critical dimension 823 and the fourth critical dimension 824, and a third function reflecting the fifth critical dimension 825, as well as a general function reflecting the prediction value 820. Among the first to third functions, a function included in the composite loss function 830 may be added to the general function.

Figure 21:
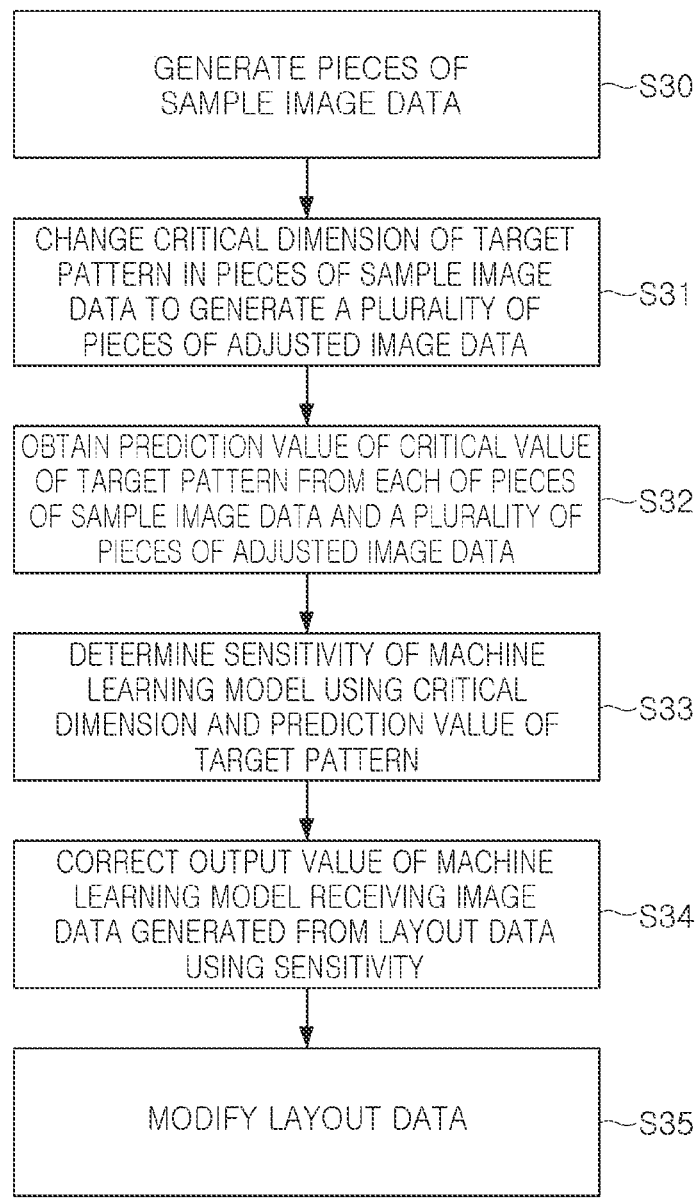
FIG. 21 is a flowchart provided illustrating a method of optimizing a machine learning model in a proximity correction method for semiconductor manufacturing processes according to some example embodiments.

FIG. 21 is a flowchart illustrating aspects of a method of optimizing a machine learning model in a proximity correction method for a semiconductor manufacturing process according to some example embodiments.

Referring to FIG. 21, a method of optimizing a machine learning model according to some example embodiments may start with generation of pieces of sample image data (S30). The pieces of sample image data may be image data generated to determine a sensitivity of the machine learning model.

As an example, it is assumed that a critical dimension of a target pattern included in the layout data is 100 μm, and a critical dimension of an actual pattern that is generated on a semiconductor substrate by a semiconductor manufacturing process performed using the layout data is 80 μm. In this case, a target value of a critical dimension of an actual pattern to be generated on the semiconductor substrate may be 100 μm. When a prediction value for a critical dimension of a target pattern output by a machine learning model receiving the layout data is 80 μm, a process proximity correction may be performed on the layout data to increase a critical dimension of the layout data to 100 μm or more. As an example, since a prediction value output by the machine learning model should be 100 μm, the critical dimension of the target pattern in the layout data may be increased by 25%.

However, in some example embodiments, when the critical dimension of the target pattern is increased or decreased by a ratio 'A' using the process proximity correction in the layout data due to sensitivity of the machine learning model, a prediction value for the critical dimension of the target pattern output by the machine learning model may be increased or decreased by 'B' different from 'A'. The pieces of sample image data may be image data for determining the sensitivity of the machine learning model and may be image data obtained by converting a specific region of the layout data into an image format.

When pieces of sample image data are generated, the critical dimension of the target pattern may be arbitrarily changed in the pieces of sample image data to generate a plurality of pieces of adjusted image data (S31). As an example, the critical dimension of the target pattern may be increased or decreased in the pieces of sample image data to generate the plurality of pieces of adjustment image data. The pieces of sample image data and the plurality of pieces of adjusted image data may be input to the machine learning model to obtain prediction values for the critical dimension of the target pattern (S32). Since the critical dimension of the target pattern has different values in the pieces of sample image data and the plurality of pieces of adjusted image data, prediction values output from the machine learning model may also be different from each other.

Sensitivity of the machine learning model may be determined using the critical dimension of the target pattern and the prediction values output from the machine learning model in each of the pieces of sample image data and the plurality of pieces of adjusted image data (S33). As an example, it is assumed that the critical dimension of the target pattern in the pieces of sample image data is 50 μm, the critical dimension of the target pattern in the first adjusted image data is 60 μm, and the critical dimension of the target pattern in the second adjusted image data is 40 μm. The sensitivity of the machine learning model may be determined by comparing a prediction value of the critical dimension output by the machine learning model for each of the first adjusted image data and the second adjusted image data with the prediction value of the critical dimension output by the machine learning model for the pieces of sample image data.

When the sensitivity is determined, prediction values of target patterns obtained by inputting input image data generated from the layout data to a machine learning model may be corrected using the sensitivity (S34). In S34, the correction using the sensitivity may be applied to be different depending on coordinates of layout data corresponding to the input image data. This may be because, even in target patterns having the same critical dimension, the sensitivity of the machine learning model varies depending on the disposition and number of surrounding patterns. As an example, sensitivity determined using pieces of sample image data may be applied to a portion of layout data in which the pieces of sample image data are generated.

When the prediction values for the critical dimensions of the target patterns are corrected based on the sensitivity, the layout data may be corrected using the prediction values for the critical dimensions of the target patterns (S35). The sensitivities may be determined to be different in regions of the layout data, and thus, different sensitivities may be applied to at least some of the regions of the layout data. According to some example embodiments, during generation of the plurality of pieces of adjusted image data, critical dimensions of surrounding patterns other than the target pattern may be adjusted together, or critical dimensions or dispositions of surrounding patterns may be changed while fixing the critical dimension of the target pattern.

The method of optimizing a machine learning model described with reference to FIG. 21 may be applied to a machine learning model after the machine learning model has finished learning using the above-described method of learning the machine learning model. As an example, after learning of a machine learning model is finished by selectively applying at least one of the various learning methods described with reference to FIGS. 8 to 20, the method of optimizing a machine learning model described with reference to FIG. 21 may be applied to the machine learning model. In some example embodiments, to prevent overfitting of the machine learning model, a plurality of pieces of input image data generated from layout data for learning the machine learning model and sample images generated from the layout data to optimize the machine learning model may be selected to be different from each other.

FIGS. 22 to 26 illustrate aspects of a method of determining sensitivity of a machine learning model in a proximity correction method for a semiconductor manufacturing process according to some example embodiments.

Figure 22:
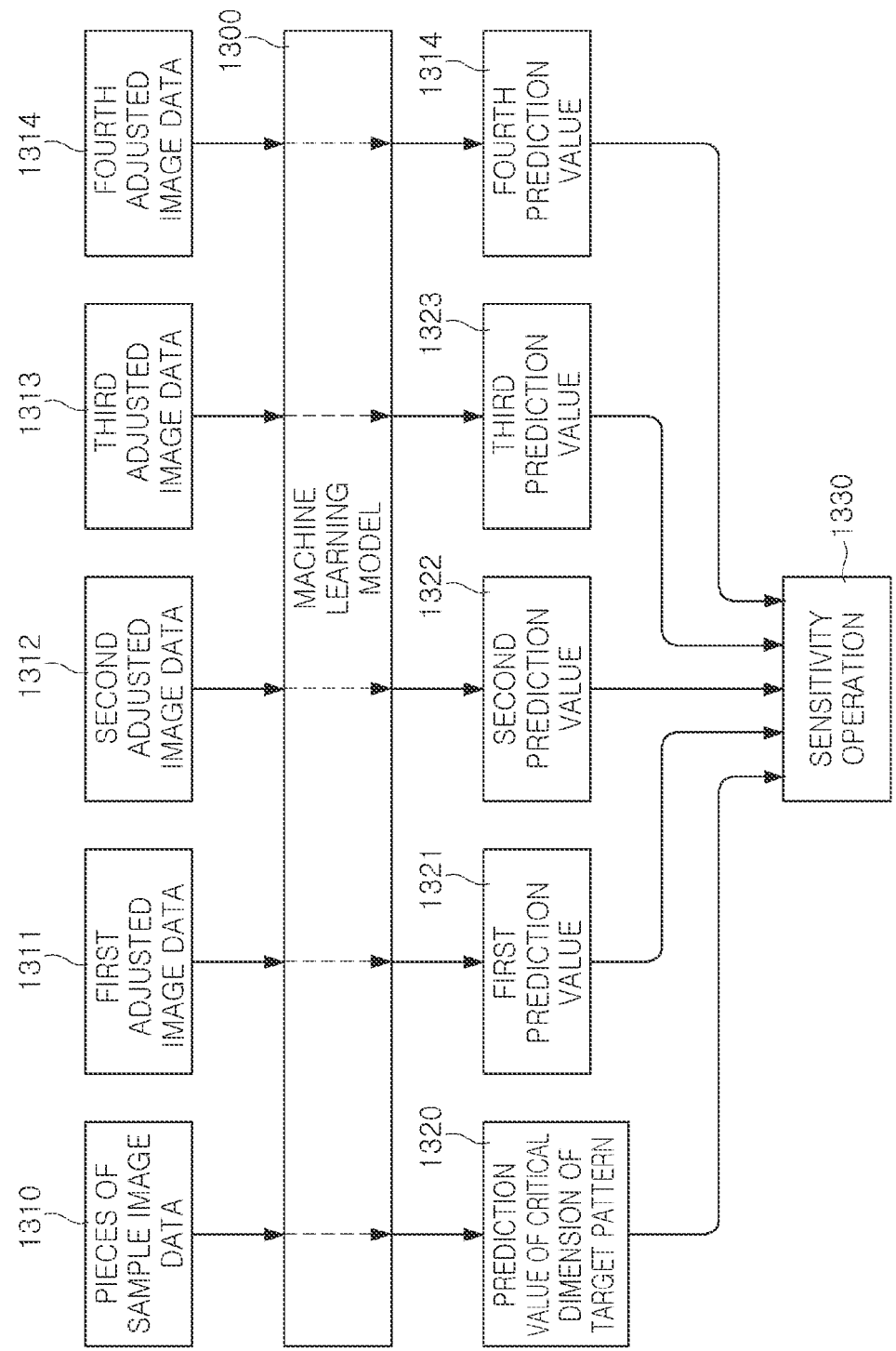

As an example, FIG. 22 illustrates aspects a method of determining sensitivity of a machine learning model 1300 using pieces of sample image data 1310 and a plurality of pieces of adjusted image data 1311 to 1314 generated by modifying the pieces of sample image data 1310. Referring to FIG. 22, the pieces of sample image data 1310 may be input to the machine learning model 1300 to obtain a prediction value 1320 for a critical dimension of a target pattern. In some example embodiments, the pieces of sample image data 1310 may be data obtained by selecting a portion of layout data and converting the selected portion into an image format.

The plurality of pieces of adjustment image data 1311 to 1314 may be generated by adjusting the critical dimension of the target pattern in the pieces of sample image data 1310, adjusting dispositions, critical dimensions, and the like of surrounding patterns except for the target pattern, or adjusting both the target pattern and the surrounding patterns. For example, the first adjusted image data 1311 may be image data obtained by increasing the critical dimension of the target pattern, and the second adjusted image data 1312 may be image data obtained by decreasing the critical dimension of the target pattern. The third adjusted image data 1313 may be image data obtained by increasing the critical dimensions of the surrounding patterns, and the fourth adjusted image data 1314 may be image data obtained by decreasing the critical dimensions of the surrounding patterns.

The machine learning model 1300 may output a prediction value for the critical dimension of the target pattern from each of the plurality of pieces of the adjusted image data 1311 to 1314. First to fourth prediction values 1321 to 1324 that are output by the machine learning model 1300 in response to the plurality of pieces of adjusted image data 1311 to 1314 may be used to calculate an adjusted value of a critical dimension for matching the critical dimension of the target pattern with a desired target value. As an example, the adjusted value of the critical dimension may be calculated by Equation 5 below.

$$\text{Adjusted Value of Critical Dimension} = \qquad \text{Equation 5}$$
$$(\text{Prediction Value} - \text{Target Value}) *$$
$$\frac{\text{First Prediction Value} - \text{Second Prediction Value}}{\text{Increase of Critical Dimension} - \text{Decrease of Critical Dimension}}$$

Equation 5 may be an equation for calculating an adjusted value and sensitivity of a critical dimension when the first adjusted image data 1311 and the second adjusted image data 1312 are input to the machine learning model. In Equation 5, the increase of a critical dimension may be the increase of the critical dimension of the target pattern of the first adjusted image data 1311 based on the target pattern of the pieces of sample image data 1310, and the decrease of a critical dimension may be the decrease of the critical dimension of the target pattern of the second adjusted image data 1312 based on the target pattern of the pieces of sample image data. A design value may be a critical dimension of a target pattern included in the pieces of sample image data 1310.

In Equation 5, an item multiplied by a difference between a prediction value and a target value may be the sensitivity of the machine learning model 1300. As a result, as described with reference to Equation 5, when the machine learning model 1300 receives the image data converted from the layout data and outputs a prediction value, the prediction value may be corrected using the sensitivity to obtain an adjusted value of a critical dimension required to correct layout data. When the third adjusted image data 1313 and the fourth adjusted image data 1314 obtained by adjusting the surrounding patterns are additionally reflected, a method of operating the sensitivity may be changed.

Figure 23:
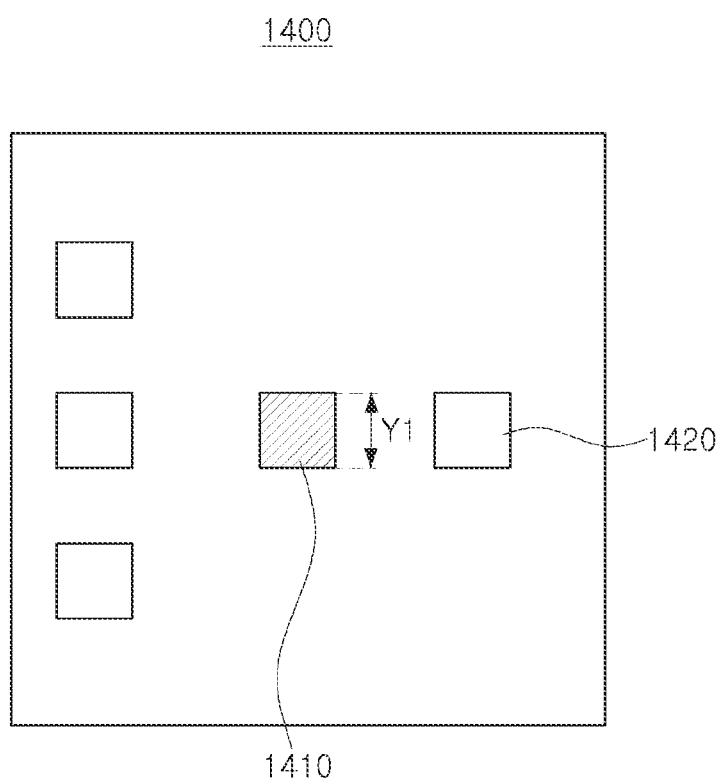

FIGS. 23 to 26 illustrate aspects of a method of generating a plurality of pieces of adjusted image data from a single piece of pieces of sample image data by adjusting a critical dimension of a target pattern. FIG. 23 illustrates pieces of sample image data 1400 obtained by selecting a portion of layout data and converting the selected portion into an image format, and the pieces of sample image data 1400 may include a target pattern 1410 and surrounding patterns 1420. The target pattern 1410 may have a first critical dimension Y1 in a vertical direction.

Figure 24:
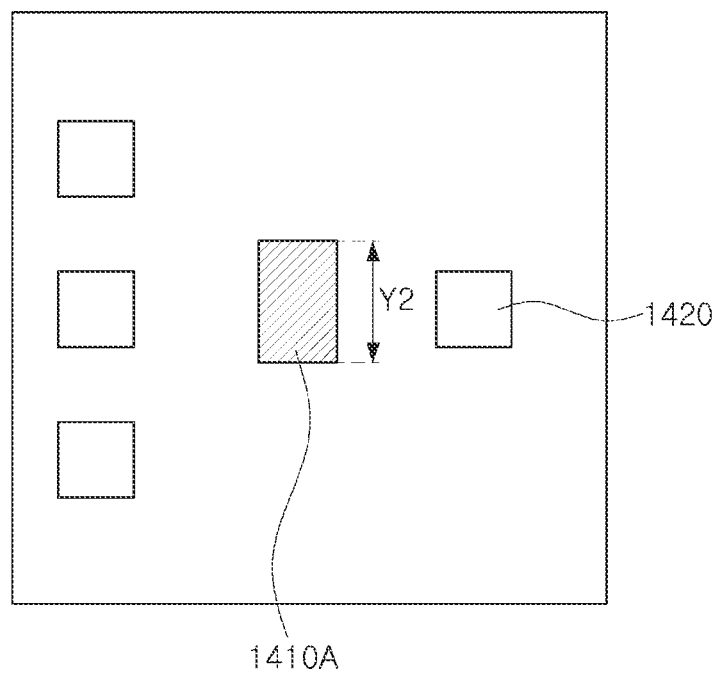

FIG. 24 illustrates first adjusted image data 1400A generated by increasing a critical dimension of a target pattern 1410 in the pieces of sample image data 1400. Referring to FIG. 24, a surrounding pattern 1420 of the first adjusted image data 1400A may be the same as the pieces of sample image data 1400. The target pattern 1410A may have a second critical dimension Y2 greater than the first critical dimension Y1. Referring to Equation 5 together, a difference between the second critical dimension Y2 and the first critical dimension Y1 may be the increase of a critical dimension included in a denominator of the sensitivity.

Figure 25:
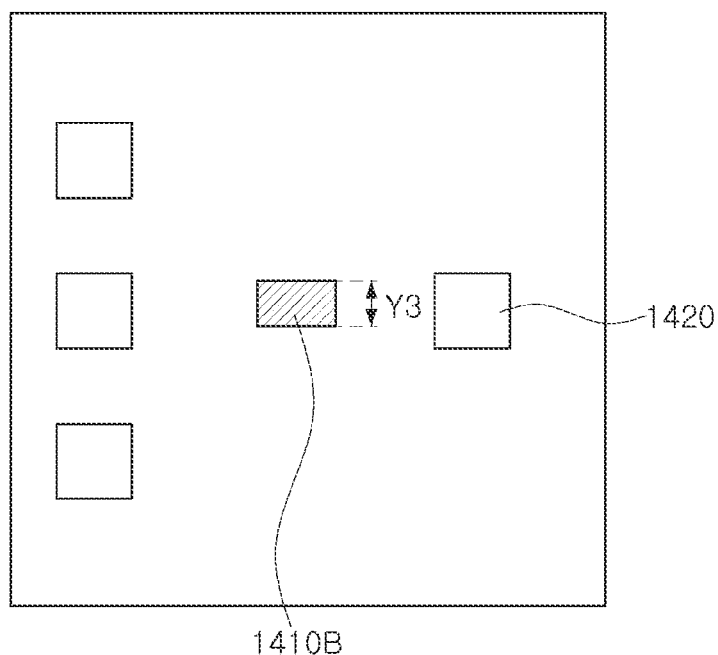

FIG. 25 illustrates second adjusted image data 1400B generated by decreasing a critical dimension of the target pattern 1410 in the pieces of sample image data 1400. Referring to FIG. 25, a surrounding pattern 1420 of the second adjusted image data 1400B may be the same as the pieces of sample image data 1400. The target pattern 1410B may have a third critical dimension Y3 that is smaller than the first critical dimension Y1. Referring to Equation 5 together, a difference between the first critical dimension Y1 and the third critical dimension Y3 may be the decrease of a critical dimension included in the denominator of the sensitivity.

Figure 26:
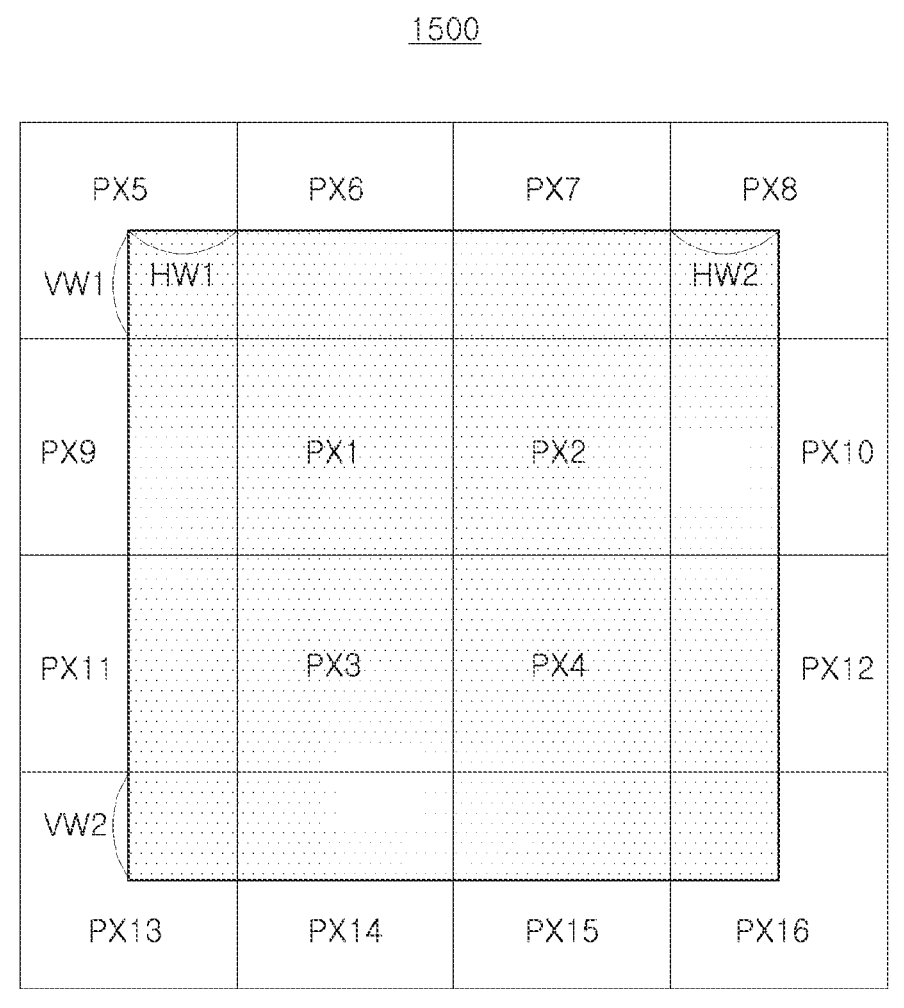

FIG. 26 illustrates aspects of a method of adjusting a critical dimension of a target pattern in detail. Referring to FIG. 26, in pieces of sample image data 1500, a target pattern 1510 may be represented by a plurality of pixels PX. Among the plurality of pixels PX, each of the other pixels PX5 to PX16, except for first to fourth pixels PX1 to PX4, may overlap the target pattern 1510 in a portion. The fifth pixel PX5 may overlap the target pattern 1510 by a first horizontal width HW1 and a first vertical width VW1, and the sixteenth pixel PX16 may overlap the target pattern 1510 by a second horizontal width HW2 and a second vertical width VW2. The pixel intensity of each of the other pixels PX5 to PX16 may be determined according to lengths of the horizontal widths HW1 and HW2 and the vertical widths VW1 and VW2.

The horizontal widths HW1 and HW2 and the vertical widths VW1 and VW2 may be adjusted such that the critical dimension of the target pattern 1510 is increased or decreased to generate a plurality of pieces of adjusted image data. As an example, the adjusted image data may be generated by increasing both the horizontal widths HW1 and HW2 and the vertical widths VW1 and VW2, or by decreasing both the horizontal widths HW1 and HW2 and the vertical widths VW1 and VW2 to generate the adjusted image data. According to some example embodiments, the adjusted image data may be generated by selectively increasing or decreasing at least one of the horizontal widths HW1 and HW2 and the vertical widths VW1 and VW2.

As described above, according to some example embodiments, layout data for performing a semiconductor manufacturing process may be input to a machine learning model to obtain a prediction value for critical dimensions of various patterns included in the layout data. A result value for the critical dimension of the patterns may be obtained from a semiconductor substrate, on which a semiconductor manufacturing process is performed, using the layout data and learning of the machine learning model may be performed based on the prediction value and the result value. The layout data may be input to the machine learning model having finished learning, and the layout data may be corrected based on a prediction value output by the machine learning model. Thus, patterns having desired critical dimensions may be formed by the semiconductor manufacturing process.

While some example embodiments have been shown and described above, it will be apparent to those skilled in the art that modifications and variations could be made without departing from the scope of the present inventive concepts as defined by the appended claims.

What is claimed is:

1. A proximity correction method for a semiconductor manufacturing process, the proximity correction method comprising:
generating a plurality of pieces of original image data from a plurality of sample regions, wherein the sample regions are selected from layout data used in the semiconductor manufacturing process, wherein each of the plurality of pieces of original image data includes at least one target pattern having a critical dimension to be measured and at least one surrounding pattern arranged around the target pattern, and wherein at least some of the plurality of pieces of original image data overlap each other;

removing some of the pieces of original image data that overlap with each other from the plurality of pieces of original image data, resulting in a plurality of pieces of input image data;

inputting the plurality of pieces of input image data to a machine learning model;

obtaining a prediction value of the critical dimensions of the target patterns included in the plurality of pieces of input image data from the machine learning model;

measuring a result value for critical dimensions of actual patterns corresponding to the target patterns on a semiconductor substrate on which the semiconductor manufacturing process is performed; and performing learning of the machine learning model using the prediction value and the result value.

2. The proximity correction method of claim 1, wherein the plurality of pieces of input image data comprises first and second pieces of input image data having different sizes.

3. The proximity correction method of claim 1, wherein at least some of the pieces of original image data that are removed are removed by using a pattern included in each of the plurality of pieces of original image data.

4. The proximity correction method of claim 3, wherein after the some pieces of original image data are removed, the plurality of pieces of input image data are generated using an image moment extracted from each of the other pieces of original image data.

5. The proximity correction method of claim 1, wherein at least one piece of input image data of the plurality of input image data has a long target pattern having a length that is greater than or equal to a predetermined reference value in a first direction, and wherein a portion of the long target pattern is removed to reduce a size of the at least one piece of input image data in the first direction.

6. The proximity correction method of claim 5, wherein the removed portion of the long target pattern is a region separated from an edge of the long target pattern extending in a second direction, intersecting the first direction.

7. The proximity correction method of claim 1, wherein each of the plurality of pieces of original image data includes location information of the sample region that corresponds to each of the plurality of pieces of original image data, and wherein each of the plurality of pieces of original image data includes a measurement value for the critical dimensions of the target patterns included in the sample region.

8. The proximity correction method of claim 7, wherein the measurement value includes at least one of a width measured in a predetermined location of each of the target patterns and an average value of widths of the target patterns.

9. The proximity correction method of claim 1, wherein among the plurality of pieces of input image data, at least one piece of input image data includes a plurality of pixels, the plurality of pixels including fixed pixels that completely overlap at least one of the target patterns, and the plurality of pixels including adjusted pixels that partially overlap at least one of the target patterns, and wherein a pixel intensity of each of the adjusted pixels is adjusted to perform augmentation processing on the at least one piece of input image data.

10. The proximity correction method of claim 9, wherein the pixels are arranged in a horizontal direction and a vertical direction and the target pattern has a horizontal width in the horizontal direction and a vertical width in the vertical direction in each of the adjusted pixels, and wherein the horizontal width of the target pattern in a second adjusted pixel is decreased by an increase in the horizontal width of the target pattern in a first adjusted pixel that is different from the second adjusted pixel.

11. The proximity correction method of claim 9, comprising generating center correction data having a value that decreases in a direction away from a center of the at least one piece of input image data, wherein the center correction data is used to compensate for coordinates movement of the target patterns in the at least one piece of input image data due to the augmentation processing.

12. The proximity correction method of claim 1, wherein each of the plurality of pieces of input image data includes the target pattern and surrounding patterns adjacent to the target pattern, and wherein learning of the machine learning model is performed using a loss function determined by at least one of a critical dimension of the target pattern, a distance between the target pattern and the surrounding patterns, a number of the surrounding patterns, or a location of the surrounding patterns obtained from at least one piece of input image data among the plurality of pieces of input image data.

13. The proximity correction method of claim 1, wherein the machine learning model includes a convolution neural network (CNN) configured to receive the plurality of pieces of input image data and output the prediction value.

14. A proximity correction method for a semiconductor manufacturing process, the proximity correction method comprising:

generating pieces of sample image data comprising a target pattern for which a critical dimension thereof is to be adjusted and comprising surrounding patterns adjacent to the target pattern, and a plurality of pieces of adjusted image data in which the critical dimension of the target pattern is changed in the pieces of sample image data;

inputting the pieces of sample image data and the plurality of pieces of adjusted image data to a machine learning model;

obtaining a prediction value for the critical dimension of the target pattern from each of the pieces of sample image data and the plurality of pieces of adjusted image data from the machine learning model;

determining a sensitivity of the machine learning model using the critical dimension of the target pattern obtained from each of the pieces of sample image data and the plurality of pieces of adjusted image data and the prediction value;

correcting an output value of the machine learning model based on the sensitivity; and modifying layout data based on the corrected output value.

15. The proximity correction method of claim 14, wherein at least one piece of adjusted image data is generated by changing only a critical dimension of the target pattern while fixing a critical dimension of the surrounding pattern.

16. The proximity correction method of claim 14, wherein at least one piece of adjusted image data is generated by simultaneously changing a critical dimension of the target pattern and a critical dimension of the surrounding pattern in the pieces of sample image data.

17. A proximity correction method for a semiconductor manufacturing process, the proximity correction method comprising:
generating a plurality of pieces of input image data from a plurality of sample regions, wherein the sample regions are selected from layout data used in the semiconductor manufacturing process and wherein each of the plurality of pieces of input image data includes at least one target pattern having a critical dimension to be measured and at least one surrounding pattern arranged around the target pattern;
inputting the plurality of pieces of input image data to a machine learning model;
obtaining a first prediction value from the machine learning model for the critical dimensions of the target patterns included in the plurality of pieces of input image data;
measuring a result value for critical dimension of actual patterns on a semiconductor substrate manufactured using the semiconductor manufacturing process that correspond to the target patterns and performing learning of the machine learning model using the first prediction value and the result value;
adjusting the critical dimension of the target pattern in at least one piece of sample image data selected from the layout data to generate a plurality of pieces of adjusted image data;
inputting the pieces of sample image data and the plurality of pieces of adjusted image data to the machine learning model to obtain a second prediction value of the critical dimension of the target pattern included in each of the pieces of sample image data and the plurality of pieces of adjusted image data;
determining a sensitivity of the machine learning model using the critical dimension of the target pattern obtained from each of the pieces of sample image data and the plurality of pieces of adjusted image data, and the second prediction value; and
optimizing the machine learning model using the sensitivity.

18. The proximity correction method of claim 17, wherein the pieces of sample image data comprises a plurality of pixels including includes fixed pixels that completely overlap the target pattern and adjusted pixels that partially overlap at least one of the target patterns, and
wherein the plurality of pieces of adjusted image data are generated by adjusting a pixel value of each of the adjusted pixels.

19. The proximity correction method of claim 17, further comprising:
inputting the layout data into the optimized machine learning model; and
modifying the layout data based on an output value of the optimized machine learning model.

20. The proximity correction method of claim 17, further comprising:
obtaining a design value for the critical dimensions of the target patterns from the layout data,
wherein learning of the machine learning model is performed using a difference between the first prediction value and the design value and a difference between the result value and the design value.

* * * * *